United States Patent [19]

Sato

[11] Patent Number: 5,790,559
[45] Date of Patent: Aug. 4, 1998

[54] SEMICONDUCTOR MEMORY TESTING APPARATUS

[75] Inventor: Shinya Sato, Tokyo, Japan

[73] Assignee: Advantest Corporation, Tokyo, Japan

[21] Appl. No.: 825,356

[22] Filed: Mar. 28, 1997

[30] Foreign Application Priority Data

| Mar. 29, 1996 | [JP] | Japan | 8-104384 |
| May 29, 1996 | [JP] | Japan | 8-135205 |
| May 29, 1996 | [JP] | Japan | 8-135206 |

[51] Int. Cl.[6] .................................................. G06F 11/60
[52] U.S. Cl. ................................................................ 371/21.3
[58] Field of Search .................................. 371/21.3, 21.2, 371/21, 25.1; 365/222, 225.7

[56] References Cited

U.S. PATENT DOCUMENTS 5,266,894  11/1993  Takagi et al. ........................ 371/25.1
5,703,823  12/1997  Douse et al. ........................... 365/222

Primary Examiner—Vincent P. Canney
Attorney, Agent, or Firm—Knobbe, Martens, Olson & Bear, LLP

[57] ABSTRACT

A memory unit for storing failure data of a semiconductor memory under test comprises a plurality of interleaved DRAMs. A buffer memory temporarily stores failure data to be stored into the DRAMs and addresses thereof. The DRAMs are associated respectively with storage controllers which store failure addresses whose row addresses correspond to the DRAMs, among inputted failure addresses, into buffer memories associated respectively with the DRAMs. Write controllers are associated respectively with the DRAMs, for reading the failure data from the buffer memories and writing the failure data into the DRAMs in a high-speed write mode.

12 Claims, 31 Drawing Sheets

SEMICONDUCTOR MEMORY TESTING APPARATUS

BACKGROUND OF THE INVENTION

1. Field of the Invention

The present invention relates to a semiconductor memory testing apparatus for testing a semiconductor memory.

2. Description of the Related Art

FIG. 1 of the accompanying drawings shows in block form a conventional semiconductor memory testing apparatus. As shown in FIG. 1, the conventional semiconductor memory testing apparatus comprises a timing generator 201, a pattern generator 202, a failure analysis memory 203, a waveform shaper 204, and a logic comparator 205, for testing a semiconductor memory 206.

The timing generator 201 generates a reference clock signal. Based on the reference clock signal generated by the timing generator 201, the pattern generator 202 outputs an address signal, test data, and a control signal to the waveform shaper 204, outputs an address to the failure analysis memory 203, and also outputs expected value data to the logic comparator 205. The waveform shaper 204 shapes the waveforms of the address signal, the test data, and the control signal into waveforms required to test the semiconductor memory 206, and applies the address signal, the test data, and the control signal which have the respective required waveforms to the semiconductor memory 206 under test. The semiconductor memory 206 under test is controlled to write and read the test data by the control signal. The test data read from the semiconductor memory 206 under test are supplied to the logic comparator 205, and compared thereby with the expected value data outputted from the pattern generator 202. It is determined whether the semiconductor memory 206 under test is good or not depending on whether the test data agree with the expected value data or not. If the test data do not agree with the expected value data, then failure data from the logic comparator 205 are stored in the failure analysis memory 203 at an address corresponding to the address of the semiconductor memory 206 under test.

Details of the failure analysis memory 203 are shown in FIG. 2 of the accompanying drawings. As shown in FIG. 2, the failure analysis memory 203 comprises an address selector 211, a memory controller 212, and a memory unit 213. The address selector 211 divides the address signal from the pattern generator 202 into a upper-order address and a low-order address depending on selecting conditions from an external source. The upper-order address is outputted to the memory controller 212, and the low-order address is outputted to the memory unit 213. There are as many memory units 213 as the number of upper-order addresses. When failure data are outputted from the logic comparator 205, the memory controller 212 outputs a write signal to the memory unit 213 which is represented by the upper-order address, for thereby storing the failure data of the semiconductor memory 206 under test into the memory unit 213. After the test, the contents of the failure analysis memory 203 are checked to analyze failure addresses of the semiconductor memory 206 under test.

Ultra-high-speed ECL devices that are to be tested as the semiconductor memory 206 operate at an access time of several nanoseconds. Some large-capacity DRAMs have a storage capacity of 64 Mbits or more. In order to test many various types of such ultra-high-speed or large-capacity memory devices, the memory unit 213 is required to comprise a memory which operates at an ultra-high speed and has a large storage capacity. Heretofore, it has been customary to meet such requirements for ultra-high speeds and large storage capacities by using an interleaved high-speed SRAM as the memory unit 213 of the failure analysis memory 203.

The memory unit 213 may be accessed by either a serial access method by which addresses sequentially increase, e.g., from #0 to #1 to #2, and a random access method by which addresses discretely change, e.g., from #FFFF to #0 to #1281. The memory unit 213 must be compatible with both of these access methods. The failure analysis memory 203 is required to have a flexible circuit arrangement which is capable of parallel operation across 1~128 bits, for example, so as to handle a bit structure of the semiconductor memory 206 under test or simultaneously test a plurality of semiconductor memories 206.

Recently, efforts to manufacture large-capacity high-speed SRAMs have slowed down, and it has been difficult to obtain large-capacity high-speed SRAMs. Semiconductor memories, mainly DRAMs, to be tested are available in large-capacity types. For increasing the storage capacity of the memory unit 213, therefore, it is preferable to use a large-capacity DRAM device as the memory unit 213. DRAM devices are capable of operating at high speeds in a high-speed page mode (or a hyperpage mode) in which column addresses are accessed within one row address as with the serial access method. However, DRAM devices operate at low speeds in the random access method in which row addresses change frequently because they need time to give a row address each time row addresses change.

The failure analysis memory 203 is accessed at addresses in the same address pattern as the address pattern which is applied to the semiconductor memory 206 under test. The addresses for accessing the failure analysis memory 203 are generally randomly generated though they depend on the test pattern which is employed. If a DRAM device is used as the memory unit 213, then it operates at a low speed because a row address is given each time it is accessed. As a result, the memory unit 213 which comprises a DRAM device needs an increased number of interleaved banks. On the other hand, the failure analysis memory 203 has an equivalent storage capacity that corresponds to only one interleaved stage. The equivalent storage capacity of the failure analysis memory 203 remains the same regardless of whether the number of interleaved banks of the memory unit 213 is four or eight. For this reason, it is preferable to minimize the number of interleaved banks of the memory unit 213 from the standpoints of circuit scale, cost, power consumption, and installation space.

An example of a process of storing data at a high speed into an interleaved memory will be described below with reference to FIGS. 4A and 4B of the accompanying drawings. FIGS. 4A and 4B are timing charts of operation of interleaved memory devices at the same high speed, one of the memory devices having an operation period which is twice the operation period of the other. In FIGS. 4A and 4B, R1, R2 represent row addresses, C1, C2 column addresses, RD1, RD2 read data, and WD1, WD2 write data. Each of the memories has interleaved banks. If the number of interleaved banks is eight, the banks are numbered with #1~#8, respectively. In a read mode for reading stored data from the banks, data produced by ORing the data of the same addresses in all the banks is used as failure address information. It will be understood that the memory device whose operation period is twice the operation period of the other memory device requires as many interleaved banks as twice those of the other memory device, and needs as many peripheral circuits and memory elements as twice those of the other memory device.

Two modes of operation of a DRAM in a read/modify/write process will be described below with reference to FIGS. 3A and 3B of the accompanying drawings. One of the modes is a normal mode in which a row address and a column addresses are established each time the memory is accessed as shown in FIG. 4A. The other mode is a high-speed page mode in which the memory is accessed by changing column addresses while one row address is being selected as shown in FIG. 4B. A comparison of operation periods of the memory in the two modes indicates that the memory can operate in the high-speed page mode at a speed which is about twice the speed in the normal mode. The difference between the operation periods is usually large because the operation period in the high-speed page mode is twice or three times the operation period in the normal mode.

Since the addresses are randomly supplied, as described above, the memory unit 203, if constructed as a DRAM, memory units of failure analysis memories in order to increase the storage capacity of failure analysis memories as the storage capacity of semiconductor memories under test increases. DRAMs have a refresh cycle to retain stored data unlike SRAMs, and also have two strobes /RAS, /CAS. Therefore, it is much more difficult to generate a timing signal for controlling DRAMs than for SRAMs. FIGS. 7A and 7B show timing charts of operation of an SRAM of multibit data duration in the same two modes as the modes shown in FIGS. 6A and 6B.

Failure analysis memories have several operation modes including a write mode, a read mode, a clear mode, a failure storage mode, etc. If a DRAM is used as a failure analysis memory and operate in these operation modes of the failure analysis memory, then almost all operation modes of the DRAM are used as shown in a table given below.

| Operation mode of failure analysis memory | Description of operation | Operation mode of DRAM |
|---|---|---|
| Write | One address is written. | Write |
| High-speed write | Several addresses are written. | Page write |
| Read | One address is read. | Read |
| High-speed read | Several addresses are read. | Page read |
| Failure storage | Failure is stored. | Read/modify/write or Page/read/modify/write |
| Mask generation | Mask data (for inhibiting a logic decision when "1") is generated. | Read |
| Clear all | Failure analysis memory is cleared. | |
| Clear | Only memory in designated mode is cleared. | Page write |
| Memory setting | Designated memory is set in bits. | |
| Memory resetting | Designated memory is reset in bits. | |
| Fix | Failure written in interleave is written in all banks. | Page/read/modify/write |
| Remove | Failure information of failure storage memory is transferred to mask generation memory. | Page/read/modify/write |
| Failure search | Failure address is searched for. | Page read |
| Failure count | Failures are counted. | |
| Memory diagnosis | Memory unit of failure storage memory is diagnosed. | |
| Copy | Data of failure storage memory is transferred to generation memory. | Page read |

Page: First page or hyperpage needs to operate in the normal mode which is of a lower speed. As a result, the number of interleaved banks increases to a level which is at least twice the number of interleaved banks in the high-speed page mode, resulting in disadvantages with respect to circuit scale, installation space, and cost.

As can be seen from the above description, if the failure analysis memory 203 comprises a DRAM for a greater storage capacity, then the failure analysis memory 203 has many interleaved banks, and is large in scale because the failure analysis memory 203 has many memory elements.

In the conventional semiconductor memory testing apparatus, the memory unit 213 of the failure analysis memory 203 comprises a high-speed SRAM of one-bit data duration. The SRAM operates in only two modes, i.e., a read mode and a write mode. FIGS. 6A and 6B of the accompanying drawings show timing charts of operation of the SRAM in those two modes.

Since efforts to manufacture large-capacity high-speed SRAMs have slowed down, as described above, it has been necessary to use DRAMs of multibit data duration as the First page or hyperpage is used in order to operate the DRAM at a high speed to process failure data and clear the failure analysis memory. Use of only the read and write modes is not allowed because the speed of operation is lowered. If a timing signal in each of the operation modes is to be generated with hardwired logic elements, then the overall memory circuit would be highly complex and would be very difficult to design. For generating a timing signal with hardwired logic elements, as shown in FIG. 8 of the accompanying drawings, a counter 221, a decoder 222, and AND and OR gates are required. When the count of the counter 221 changes from #1 to #1 to #2, the decoder 222 generates corresponding signals by decoding these count values, and AND and OR gates in timing generators $224_1$~$224_n$ control these generated signals so as to be outputted as control signals (/RAS, /CAS, /WE, /OE, etc. of the DRAM) or not. Inasmuch as the counter 221 has different sequences (for controlling the counter 221 to increment, hold, and load the count) in the operation modes of the DRAM, sequence control signals are generated by AND and OR gates in sequence control circuits $223_1$~$223_n$. As shown in FIG. 8, each of the timing generators $224_1$–$224_n$ and the sequence control circuits $223_1$–$223_n$ is of a complex arrangement which comprises many AND and OR gates.

DRAMs have their speeds of operation increased from generation to generation. If operation cycles of a failure analysis memory in the form of a high-speed DRAM are to be reduced for increasing the speed of operation of the failure analysis memory, then a timing generator which comprises hardwired logic elements cannot generate a timing signal for reducing the operation cycles unless the timing generator is modified for a circuit change. Practically, therefore, the operation cycles of the failure analysis memory cannot be reduced.

SUMMARY OF THE INVENTION

It is an object of the present invention to provide a semiconductor memory testing apparatus which includes a failure analysis memory (AFM) having a memory unit with a reduced number of interleaved banks.

Another object of the present invention to provide a semiconductor memory testing apparatus which is capable of generating a timing signal for controlling a DRAM without u se of hardwired logic elements.

According to an aspect of the present invention, there is provided a semiconductor memory testing apparatus for testing a semiconductor memory, comprising a memory unit having an address space substantially equal to the address space of a semiconductor memory under test, for storing failure data of the semiconductor memory under test, the memory unit comprising a plurality of interleaved DRAMs, buffer memory means associated respectively with the DRAMs, for temporarily storing failure data stored in the DRAMs and addresses thereof, storage control means associated respectively with the DRAMs, for storing failure addresses whose row addresses correspond to the DRAMs, among inputted failure addresses, into the buffer memory means associated respectively with the DRAMs, and write control means associated respectively with the DRAMs, for reading the failure data from the buffer memory means and writing the failure data into the DRAMs in a high-speed write mode.

Based on the fact that addresses generated by a pattern generator have a random address pattern having some regularity or a linear address pattern, the DRAMs are operated in a high-speed page mode to store failure data, and are associated with respective controllers. With the present invention, the number of interleaved banks of a memory used in a failure analysis memory is reduced.

The pattern generator comprises an ALPG (algorithmic pattern generator) which includes an arithmetic means for generating an address pattern as a test pattern dedicated for memories. A known test pattern such as PING PONG, GALLOPING, MSCAN, CHECKER BOARD, ROW BAR, COLUMN BAR, ADDRESS COMPLEMENT, or STRIPE is used as an address pattern for testing memories. The address pattern generated by the ALPG is an address pattern which is random but has certain regularity.

The generation of address patterns which are random but have certain regularity is shown in FIGS. 5A, 5B, and 5C of the accompanying drawings. FIG. 5A shows an address pattern for serial access. FIG. 5B shows an address pattern for alternately accessing addresses that are incremented by 1 from a minimum address and decremented by 1 from a maximum address. FIG. 5C shows an address pattern of the interference type for accessing one address a plurality of times. According to these address patterns, the memory is accessed frequently in one row address.

Each of the storage control means comprises means for starting a comparison between a presently inputted row address and a previously inputted row address when the corresponding buffer memory means is empty, and, if the compared row addresses agree with each other, outputting a failure address storage control signal to store a failure address into the corresponding buffer memory means and incrementing the number of times that a failure address is stored into the corresponding buffer memory means, repeating the starting of the comparison, the outputting of the failure address storage control signal, and incrementing the number of times each time a row address is inputted, and stopping the comparison between the row addresses when the number of times represents a state immediately prior to an overflow of the buffer memory means.

Alternatively, each of the storage control means comprises a buffer counter for counting the number of times that a failure address is stored into the corresponding buffer memory means, a comparison flag which is in an ON state when the buffer counter indicates that the corresponding buffer memory means is empty and is in an OFF state when the buffer counter indicates that the corresponding buffer memory means is full, address comparison means for detecting agreement or disagreement between a presently inputted row address and a previously inputted row address when the comparison flag is in the ON state, and incrementing the buffer counter when agreement between the row addresses is detected, and means responsive to failure data, for outputting a failure address storage control signal to the corresponding buffer memory means when agreement between the row addresses is detected by the address comparison means, as well as further means for counting up and indicating the next empty DRAM when agreement between the row addresses is detected by the address comparison means of all the storage control means.

According to another aspect of the present invention, there is provided a semiconductor memory testing apparatus for testing a semiconductor memory, comprising a memory unit having an address space substantially equal to the address space of a semiconductor memory under test, for storing failure data of the semiconductor memory under test, the memory unit comprising a plurality of interleaved DRAMs, buffer memory means associated respectively with the DRAMs, for temporarily storing failure data stored in the DRAMs and addresses thereof, and address converting means for converting random addresses from a pattern generator into serial addresses.

Since serial addresses are generated by the address converting means, failure data can be stored into the DRAMs at a high speed. Therefore, the number of interleaved banks may be reduced, and the number of memory elements used in the failure analysis memory may be reduced.

As shown in FIG. 23 of the accompanying drawings, test address patterns for testing a semiconductor memory include a serial access pattern for serially accessing addresses, an access pattern for alternately accessing addresses which are incremented by 1 from a minimum address and addresses which are decremented by 1 from a maximum address, and an access pattern for obliquely accessing a memory matrix. According to the present invention, test address patterns other than these serial access patterns are converted into serial access patterns for operating the DRAMs in a page mode.

The address converting means comprises a serial address generating pointer for generating serial addresses, and a conversion memory for writing therein the serial addresses based on addresses and a write signal from the pattern generator and reading therefrom the serial addresses based on address signals and a read signal from the pattern generator.

The semiconductor memory testing apparatus further comprises a plurality of multiplexers associated respectively with the DRAMs, for switchingly outputting row addresses and column addresses read from the buffer memory means, an address converter for converting random addresses from the pattern generator into serial addresses, an address selector for dividing serial addresses outputted from the address converter into row addresses and column addresses and outputting the row addresses and the column addresses to the buffer memory means, an address agreement detector for being supplied with row addresses outputted from the address selector, and, if a presently inputted row address and a previously inputted row address agree with each other, outputting a page flag signal indicative of a page mode of operation, a buffer counter for counting failure cycles and returning a count to zero when the failure cycles are counted up to a maximum value, a bank counter for counting up when the failure cycles are counted up to the maximum value by the buffer counter, a failure storage signal generator for decoding a count of the bank counter and outputting a failure storage signal which is a write signal for failure data to the corresponding buffer memory means, and a plurality of memory controllers associated respectively with the DRAMs, for being supplied with the page flag signal and the failure storage signal, outputting a switching signal to the multiplexers and outputting timing signals to the DRAMs, refreshing the DRAMs, and storing failure data into the DRAMs in a read/modify/write mode.

Each of the memory controllers comprises a refresh timer for generating a refresh request signal, a failure storage trigger generator for being supplied with the failure storage signal and a one-address storage signal which is outputted each time the storage of failure data into the corresponding DRAM is finished, turning on a failure storage operation flag and outputting a failure storage trigger signal to start storing the failure data from the buffer memory means into the DRAM when a refresh operation flag is turned off and a count of the failure storage signal and a count of the one-address storage signal disagree with each other, a refresh trigger generator responsive to the refresh request signal for turning on the refresh operation flag and outputting a refresh start signal when the failure storage operation flag is turned off, a read/modify/write circuit for effecting the read/modify/write mode to store failure data into the DRAM, a timing generation memory for storing in advance timing data to refresh the DRAM and store the failure data into the DRAM, a program counter for generating address pointers for the timing generation memory, a sequence memory for storing sequence data to increment, decrement, and hold data in the program counter, the sequence memory having address pointers generated by the program counters, and a sequence controller for operating the program counter according to the sequence data outputted from the sequence memory in response to the failure storage trigger signal outputted from the failure storage trigger generator or the refresh start signal outputted from the refresh trigger generator.

The failure storage trigger generator comprises an buffer memory storage counter for counting the failure storage signal, a DRAM storage counter for counting the one-address storage signal, a counter comparator for comparing a count of the buffer memory storage counter and a count of the DRAM storage counter with each other, and a circuit for generating and outputting the failure storage trigger signal when the counts of the buffer memory storage counter and the DRAM storage counter disagree with each other and failure data is not stored into the DRAM, and when the counts of the buffer memory storage counter and the DRAM storage counter disagree with each other and the page mode or the read/modify/write mode for storing failure data into the DRAM is finished.

According to still another aspect of the present invention, there is also provided a semiconductor memory testing apparatus for testing a semiconductor memory, comprising a memory unit having an address space substantially equal to the address space of a semiconductor memory under test, for storing failure data of the semiconductor memory under test, the memory unit comprising a plurality of interleaved DRAMs, buffer memory means associated respectively with the DRAMs, for temporarily storing failure data stored in the DRAMs and addresses thereof, a plurality of multiplexers associated respectively with the DRAMs, for switchingly outputting row addresses and column addresses read from the buffer memory means, an address converter for converting random addresses from the pattern generator into serial addresses, an address selector for dividing serial addresses outputted from the address converter into row addresses and column addresses and outputting the row addresses and the column addresses to the buffer memory means, a read/write request signal generator for being supplied with row addresses outputted from the address selector, and, if a presently inputted row address and a previously inputted row address agree with each other, outputting a page flag signal indicative of a page mode of operation, and outputting a read/write request signal for reading and writing failure data to the corresponding buffer memory means when failure data are to be written into and read from the buffer memory means, and a plurality of memory controllers associated respectively with the DRAMs, for being supplied with the page flag signal and the read/write request signal, outputting a switching signal to the multiplexers and outputting timing signals to the DRAMs, refreshing the DRAMs, and storing failure data into the DRAMs in a read/modify/write mode.

With the arrangement of the present invention, timing signals required to control the operation modes are not generated by hardwired logic elements, but generated by providing a counter and a timing generation memory which stores timing data needed for the operation modes of the DRAMs, and accessing the timing generation memory of the count of the counter to output data for use as the timing signals. The timing signals thus generated can handle all the operation modes of the failure analysis memory and can be changed without circuit modifications.

Each of the memory controllers comprises a refresh timer for generating a refresh request signal, a read/write trigger generator for being supplied with the failure storage signal and a one-address storage signal which is outputted each time the storage of failure data into the corresponding DRAM is finished, turning on a read/write operation flag and outputting a read/write trigger signal to start a read/write mode of operation of the DRAM when a refresh operation flag is turned off and the read/write request signal is supplied, a refresh trigger generator responsive to the refresh request signal for turning on the refresh operation flag and outputting a refresh start signal when the failure storage operation flag is turned off, a circuit for effecting operation modes of the DRAM, a timing generation memory for storing in advance timing data to refresh the DRAM and store the failure data into the DRAM, a program counter for generating address pointers for the timing generation memory, a sequence memory for storing sequence data to increment, decrement, and hold data in the program counter, the sequence memory having address pointers generated by the program counters, an operation mode register for storing start addresses of the timing generation memory and the sequence memory in each of the operation modes, and a sequence controller for operating the program counter according to the sequence data outputted from the sequence memory in response to the read/write trigger signal outputted from the read/write trigger generator or the refresh start signal outputted from the refresh trigger generator.

The data stored in the timing generation memory and the sequence memory can be rewritten from a tester processor which controls the semiconductor memory testing apparatus in its entirety.

Each of the buffer memory means comprises an FIFO memory.

The above and other objects, features, and advantages of the present invention will become apparent from the following description with reference to the accompanying drawings which illustrate examples of the present invention.

BRIEF DESCRIPTION OF THE DRAWINGS

FIG. 11B is a timing chart of operation of the failure storage trigger generator shown in FIG. 11A for generating a failure storage trigger signal;

DETAILED DESCRIPTION OF THE PREFERRED EMBODIMENTS

Figure 9:
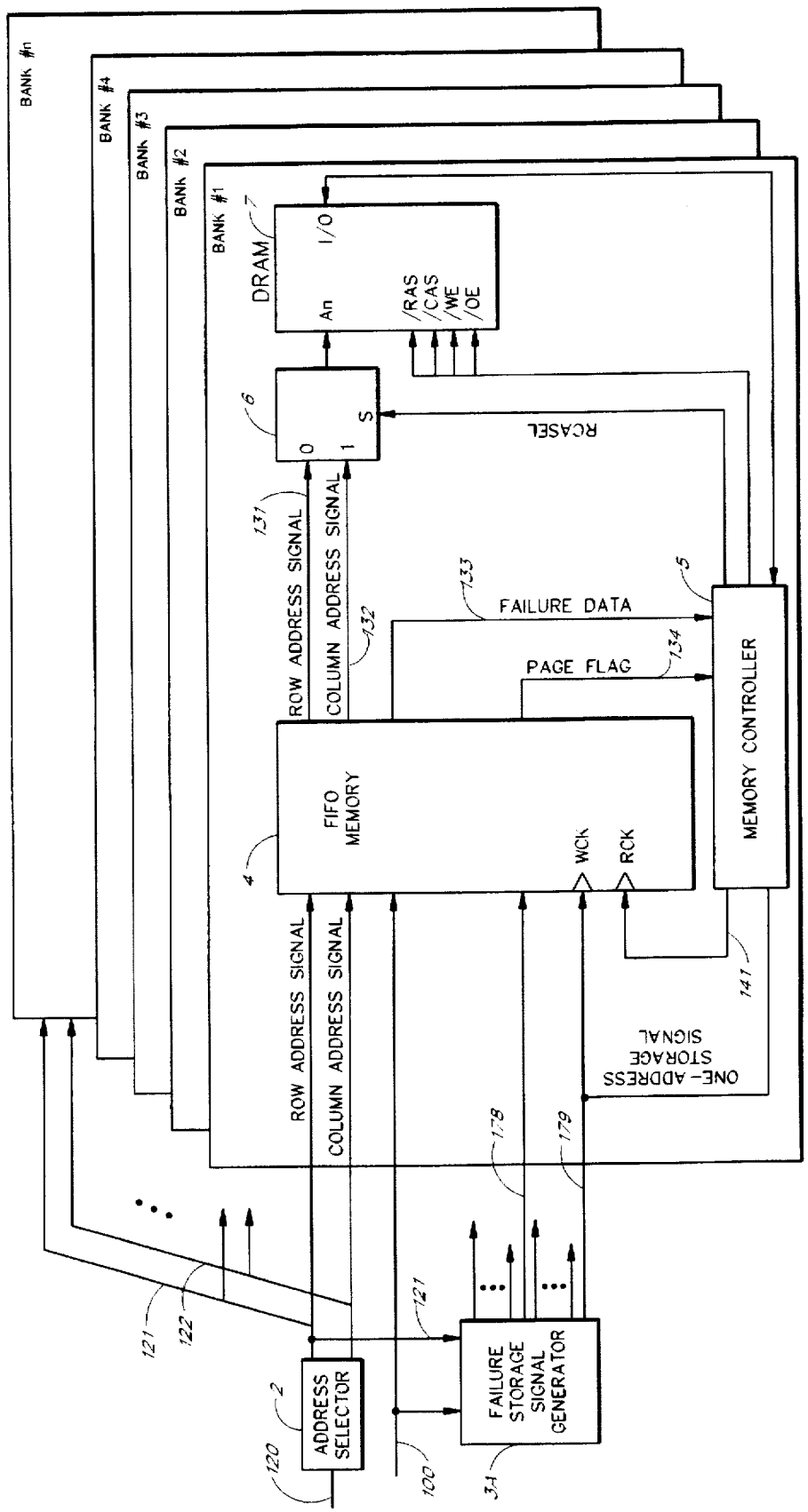
FIG. 9 is a block diagram of a failure analysis memory of a semiconductor memory testing apparatus according to a first embodiment of the present invention.

As shown in FIG. 9, a failure analysis memory of a semiconductor memory testing apparatus according to a first embodiment of the present invention generally comprises an address selector 2, a failure storage signal generator 3A, an FIFO memory 4, a memory controller 5, a multiplexer 6, and a DRAM (memory unit) 7. The FIFO memory 4, the memory controller 5, the multiplexer 6, and the DRAM 7 are provided in each of banks #1~#n of the failure analysis memory.

Figure 1:
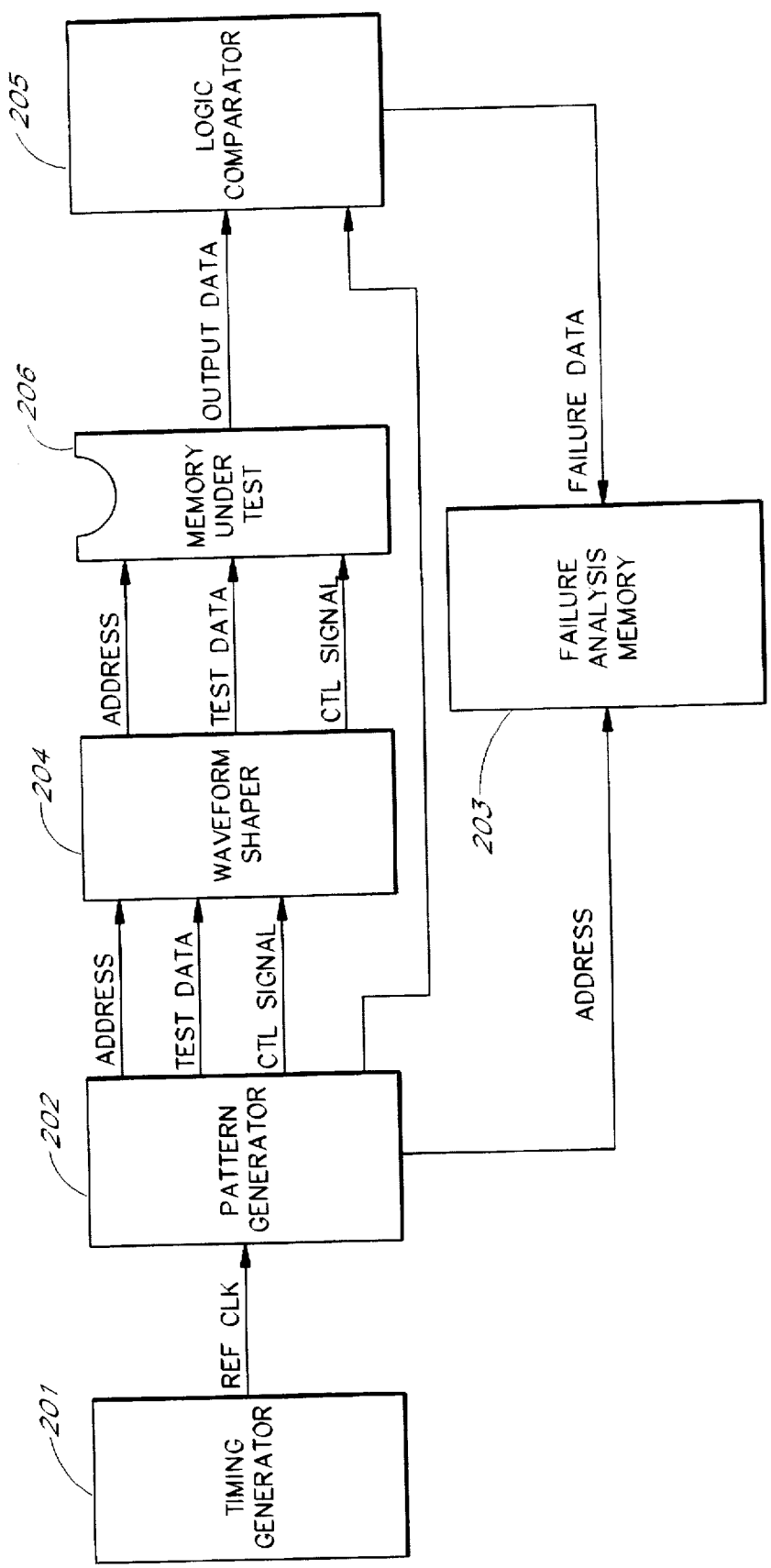
FIG. 1 is a block diagram of a conventional semiconductor memory testing apparatus.
Figures 5A, 5B, 5C:
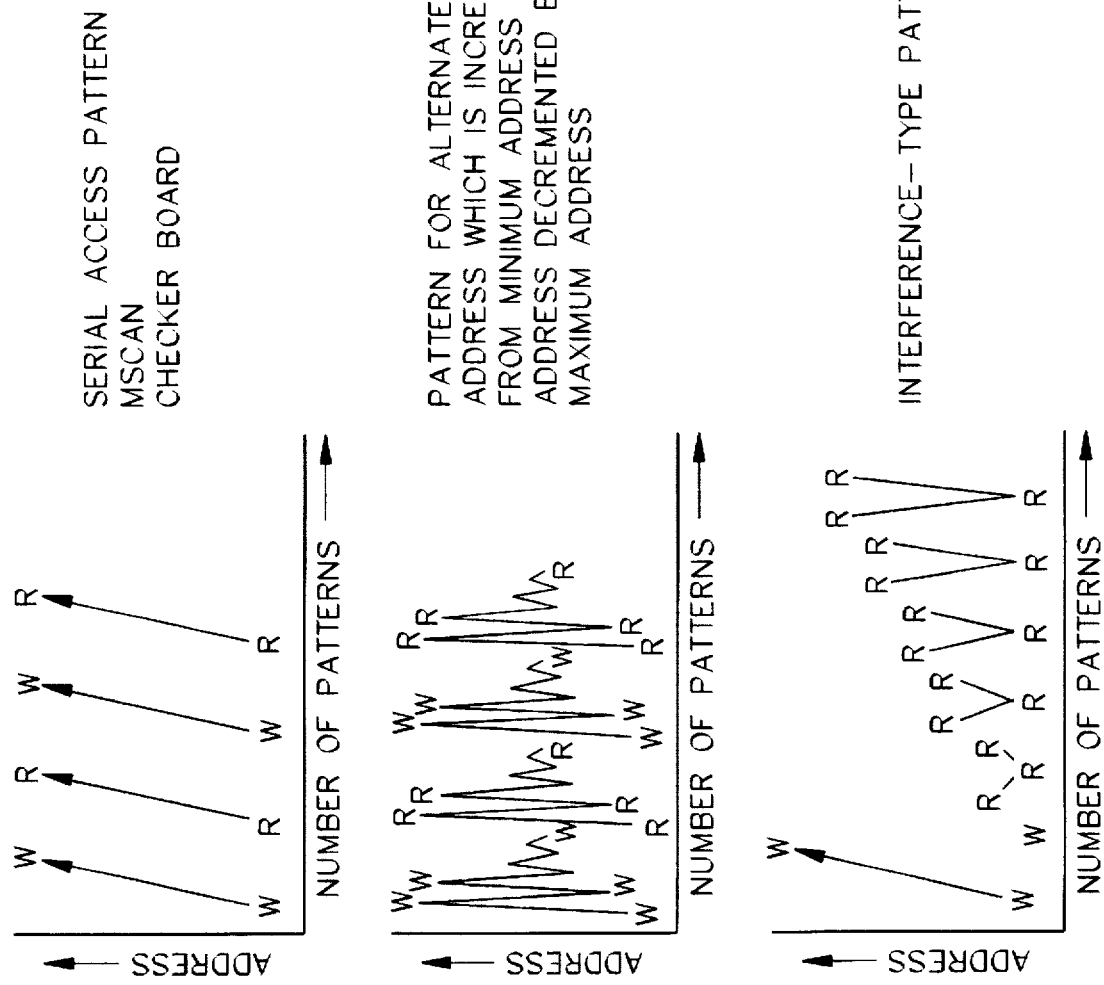
FIGS. 5A, 5B, and 5C are diagrams showing address patterns which are applied when a semiconductor memory is tested.
Figure 6A:
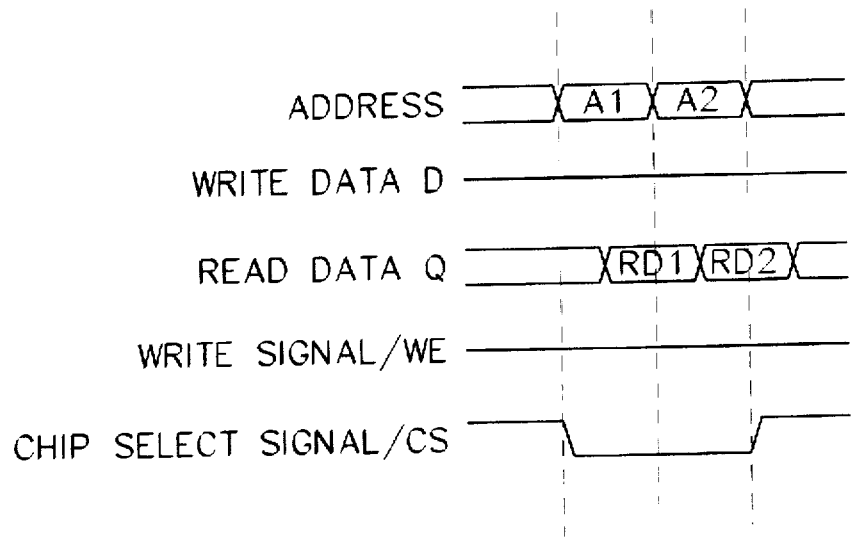
FIGS. 6A and 6B are timing charts of operation of a SRAM in respective read and write modes.
Figure 6B:
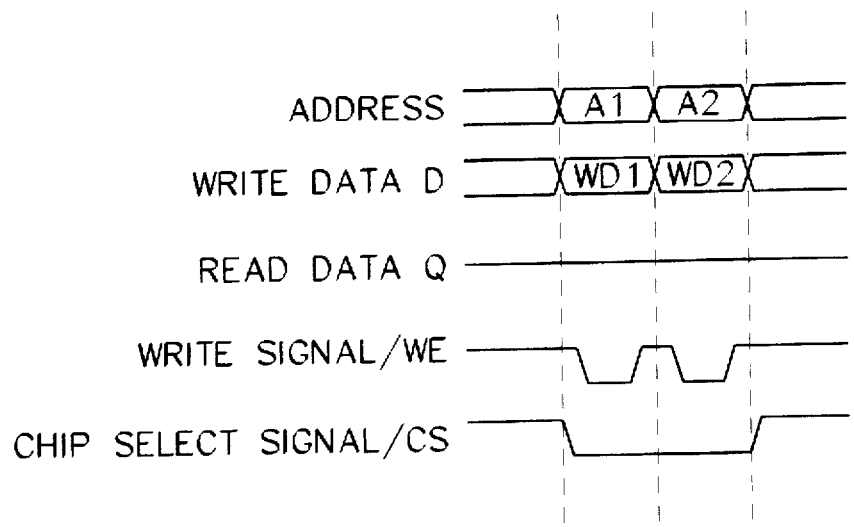
Figure 7A:
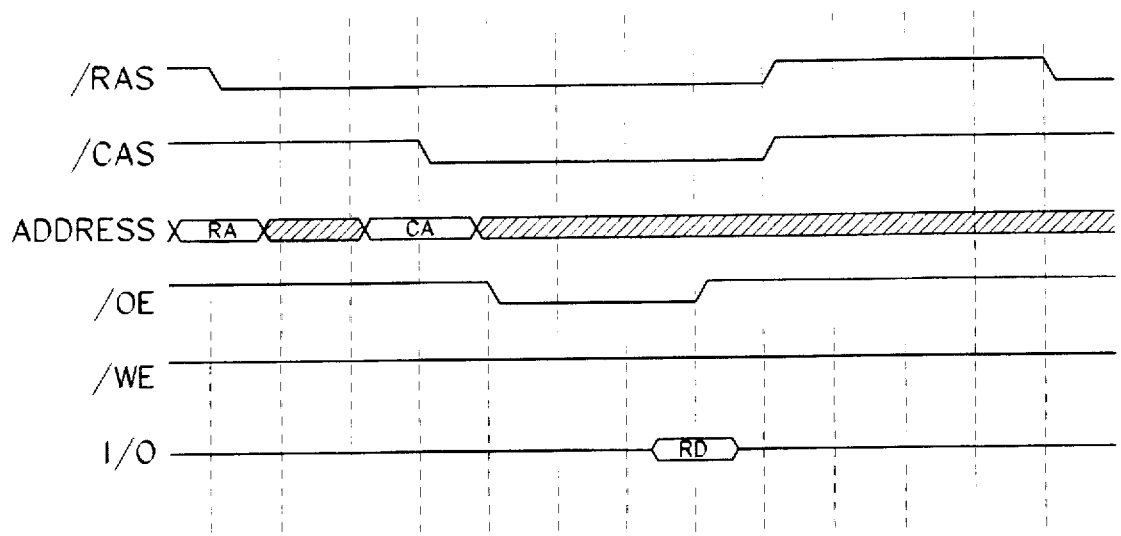
FIGS. 7A and 7B are timing charts of operation of a DRAM of multibit data duration in respective read and write modes.
Figure 7B:
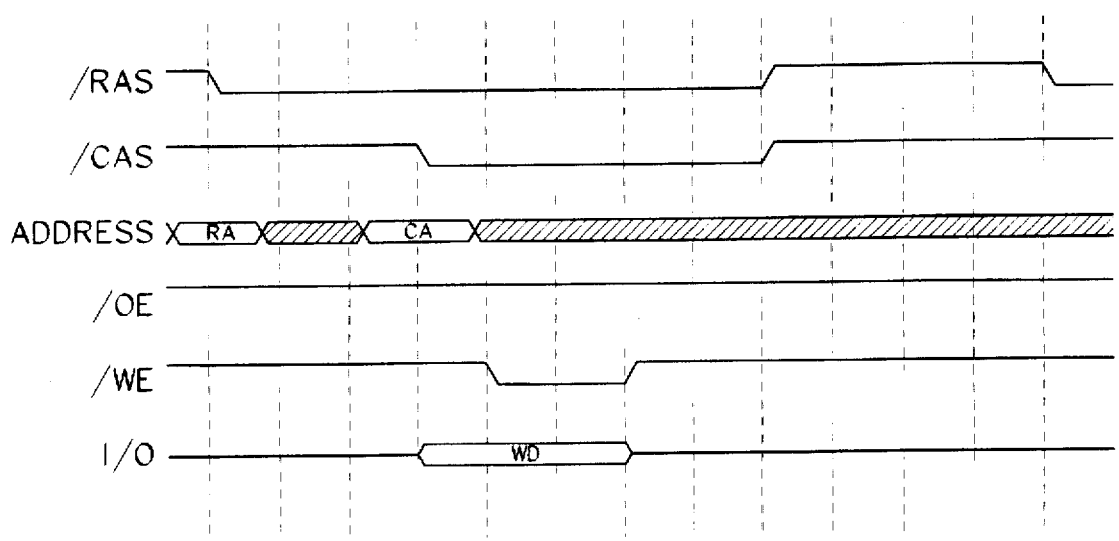
Figure 8:
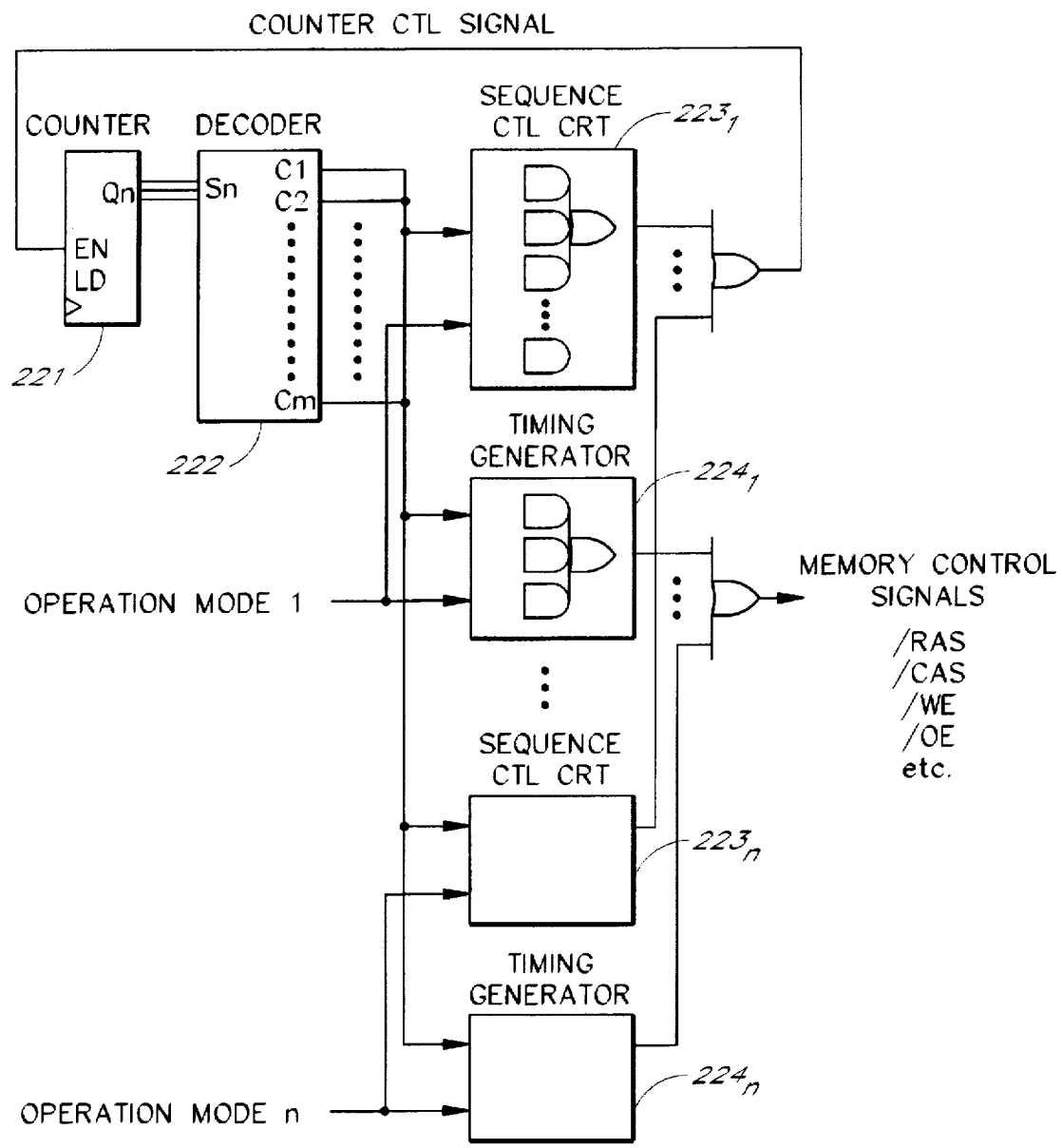
FIG. 8 is a block diagram of a circuit arrangement for generating timing signals in operation modes with hardwired logic elements.

The address selector 2 receives a failure address 120 from a pattern generator, similar to the pattern generator 202 shown in FIG. 1, and, in response to setting conditions from an external source, selectively assigns and outputs row addresses 121 in order to increase the hit rate in the same row address, based on the generation of addresses which are random but have certain regularity as shown in FIGS. 5A, 5B, and 5C. Column addresses 122 are remaining addresses. These row and column addresses 121, 122 are supplied to the banks #1~#n of the failure analysis memory. The row addresses 121 are also supplied to the failure storage signal generator 3A. The row and column addresses 121, 122 are divided such that the DRAMs 7 of the banks #1~#n increase the hit ratio in the same row address within a short time interval for generating failure addresses.

The FIFO memory 4 temporarily stores failure data 100 of the same row address. The FIFO memory 4 receives the row and column addresses 121, 122 and the failure data 100 from a logic comparator, similar to the logic comparator 205 shown in FIG. 1, and stores the failure data 100 if there is a corresponding failure storage signal from the failure storage signal generator 3A. The FIFO memory 4 provides a wait time while the DRAM 7 is operating in a refresh mode, and is capable of storing successive failure data of the same row address.

The DRAM 7 comprises a plurality of DRAM elements each having a desired large storage capacity. The DRAM 7 receives an address signal which is generated by the multiplexer 6 when it multiplexes a row address signal 131 and a column address signal 132 that are supplied from the FIFO memory 4 to the multiplexer 6.

The memory controller 5 effects a read control process for reading failure data from the FIFO memory 4 and a high-speed page write control process for writing pages into the DRAM 7 at a high speed. In a first cycle of the high-speed page write control process, row addresses of the DRAM 7 are accessed.

Figure 10:
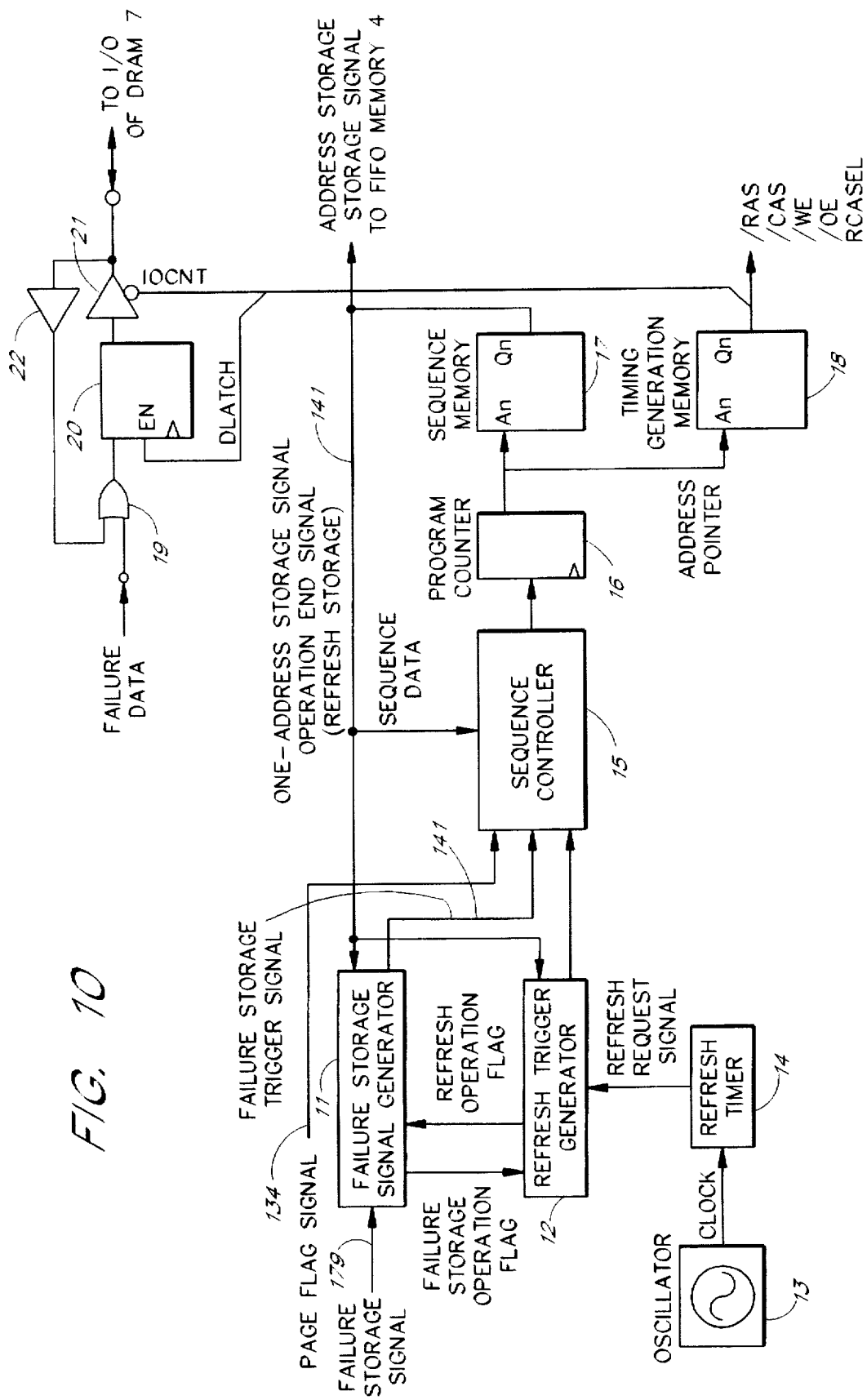
FIG. 10 is a block diagram of a memory controller in the semiconductor memory testing apparatus shown in FIG. 9.

As shown in FIG. 10, the memory controller 5 comprises a failure storage trigger generator 11, a refresh trigger generator 12, an oscillator 13, a refresh timer 14, a sequence controller 15, a program counter 16, a sequence memory 17, a timing generation memory 18, an OR gate 19, a flip-flop 20, a three-state buffer 21, and a buffer 22.

In response to a failure storage signal 179, the failure storage trigger generator 11 generates a failure storage trigger signal for controlling the DRAM 7 to start a failure storage operation.

Figure 11A:
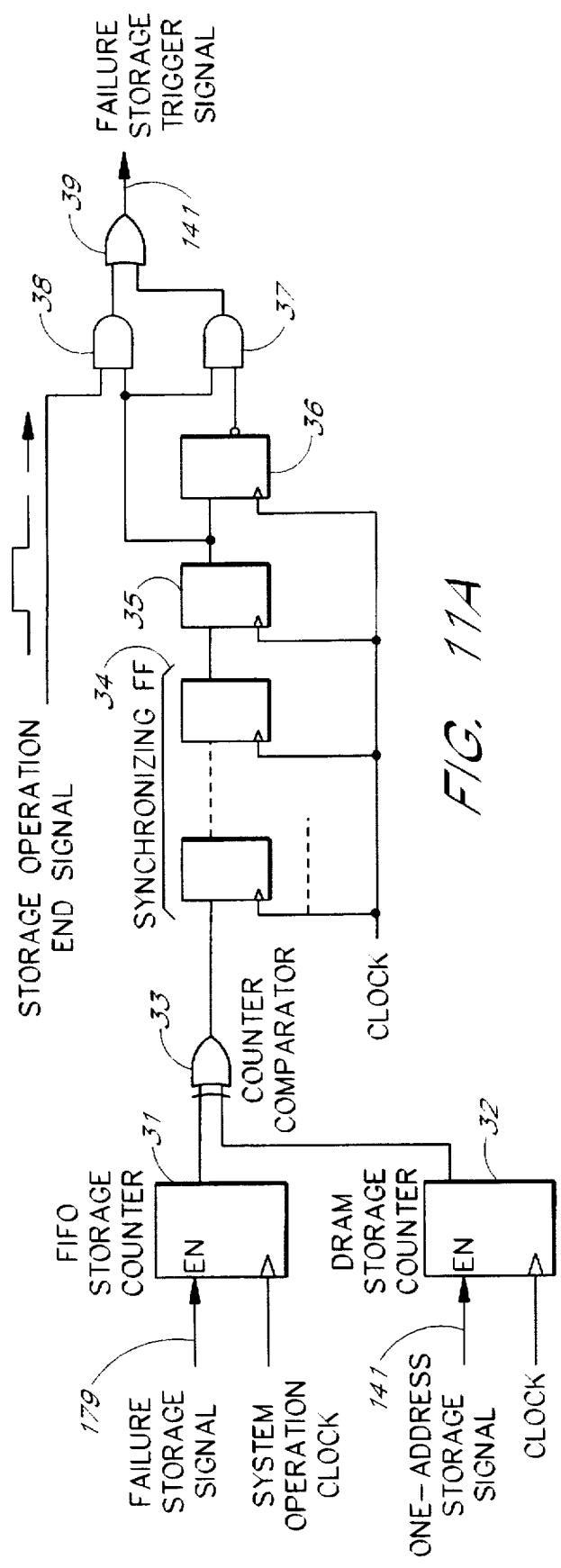
FIG. 11B is a block diagram of a failure storage trigger generator in the memory controller shown in FIG. 10.
Figure 11B:
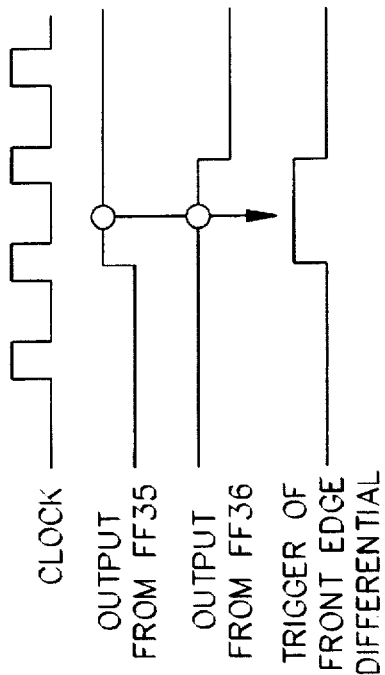

As shown in FIG. 11A, the failure storage trigger generator 11 comprises an FIFO storage counter 31, a DRAM storage counter 32, a counter comparator 33, synchronizing flip-flops 34, flip-flops 35, 36, AND gates 37, 38, and an OR gate 39. The FIFO storage counter 31 counts failure storage signals 179 generated by the failure storage signal generator 3A, and the DRAM storage counter 32 counts one-address storage signals 141 outputted from the sequence memory 17. The counter comparator 33 outputs a disagreement signal when the count of the FIFO storage counter 31 and the count of the DRAM storage counter 32 disagree with each other. As shown in FIG. 11B, the flip-flops 35, 36 and the AND gate 37 generate a differential signal of the front edge of the disagreement signal, and supply it as a failure storage trigger signal, which is applied to control the DRAM 7 to start a failure storage operation. The FIFO storage counter 31 operates in synchronism with a clock signal supplied from a timing generateor 201, and the DRAM storage counter 32 operates in synchronism with a clock signal from an oscillator in the failure analysis memory. Since the count comparator 33 is an asynchronous circuit, the synchronizing flip-flops 34 are inserted between the counter comparator 33 and the flip-flop 35 in order to synchronize the disagreement signal with the clock signal supplied from the oscillator. When a process of storing one address of failure data into the DRAM 7 is finished and a one-address storage signal 141 is supplied to the DRAM storage counter 32, the DRAM storage counter 32 counts up, and the counter comparator 33 outputs an agreement signal. As a result, the failure data storage operation of the DRAM 7 comes to an end. If the counter comparator 33 outputs a disagreement signal even when the DRAM storage counter 32 counts up, then a storage operation end signal (outputted when a page mode or a read/modify/write mode is finished) is outputted as a next failure storage trigger signal from the AND gate 38, controlling the DRAM 7 to start a failure storage operation.

The refresh trigger generator 12 starts a refresh operation in response to a refresh request from the refresh timer 14. In the failure storage operation or the refresh operation, the trigger generators 11, 12 output a failure storage operation flag and a refresh output a failure storage operation flag and a refresh operation flag, respectively, to the other trigger generators 12, 11 to hold either one of the failure storage operation and the refresh operation in a wait state so that the failure storage operation and the refresh operation will not compete with each other. When an operation end signal is supplied from the sequence memory 17, either the failure storage operation flag or the refresh operation flag is dropped, starting the operation which has been held in the wait state. The refresh timer 14 measures time with a clock signal supplied from the oscillator 13. When a refresh time for one address (=refresh time of the DRAM 7/ refresh cycle of the DRAM 7) is reached, the refresh timer 14 outputs a refresh request signal to the refresh trigger generator 12. The refresh time of the DRAM 7 is a period of time during which the DRAM 7 can hold data without being refreshed. If the DRAM 7 is not refreshed within the refresh time, the data stored in the DRAM 7 is eliminated. The refresh cycle of the DRAM 7 is the number of refreshes to be made within the refresh time, and depends on the number of row addresses of the DRAM 7. If the DRAM 7 is not refreshed as many times as the refresh cycle within the refresh time, the data stored in the DRAM 7 is eliminated.

Figure 3A:
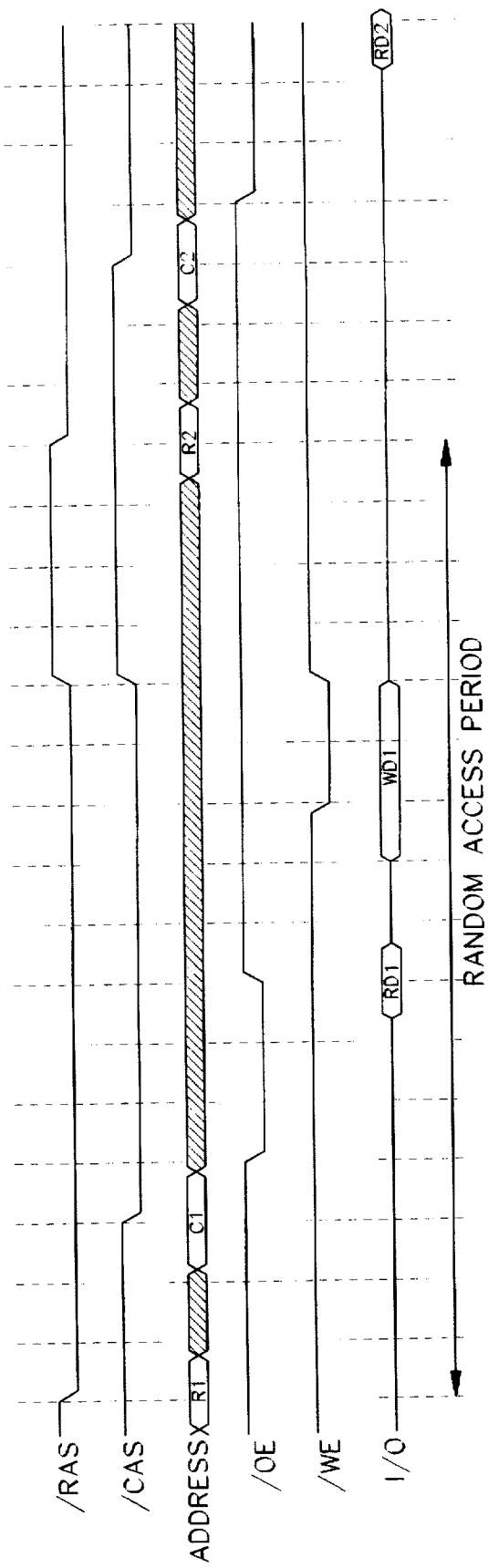
FIGS. 3A and 3B are timing charts of a read/modify/write process of operation of interleaved memory devices in respective random and serial access modes.
Figure 3B:
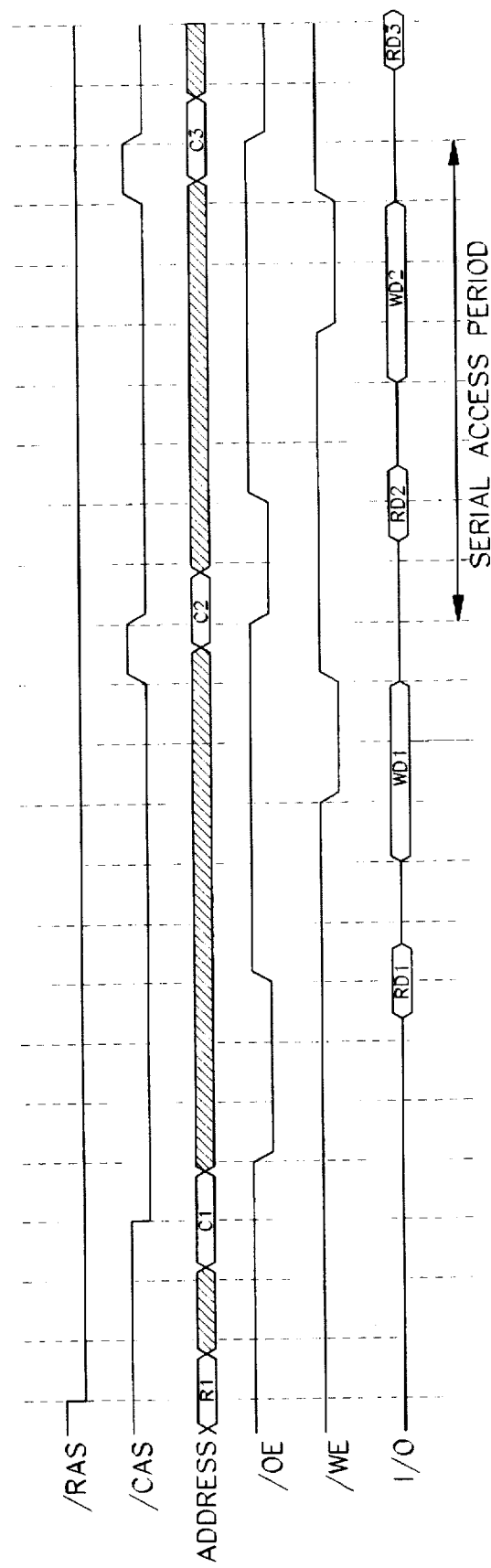
Figure 4A:
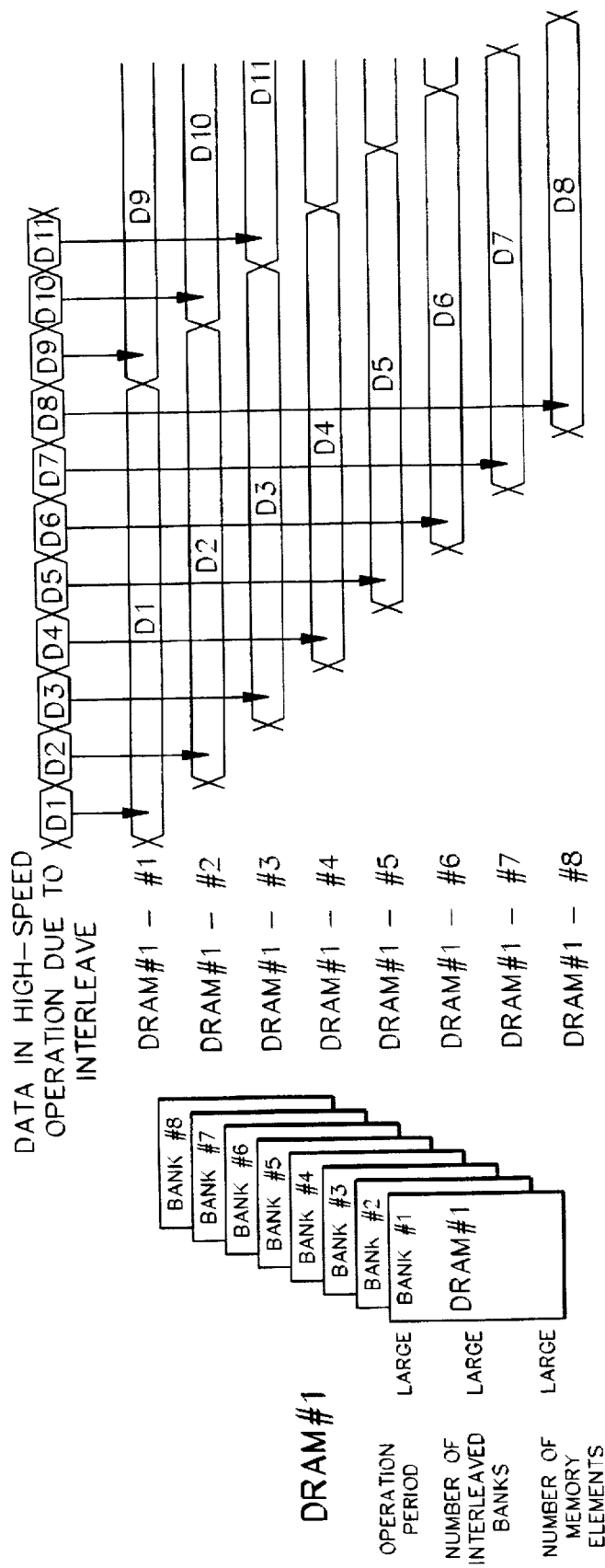
FIGS. 4A and 4B are diagrams illustrative of an interleaved process.
Figure 4B:
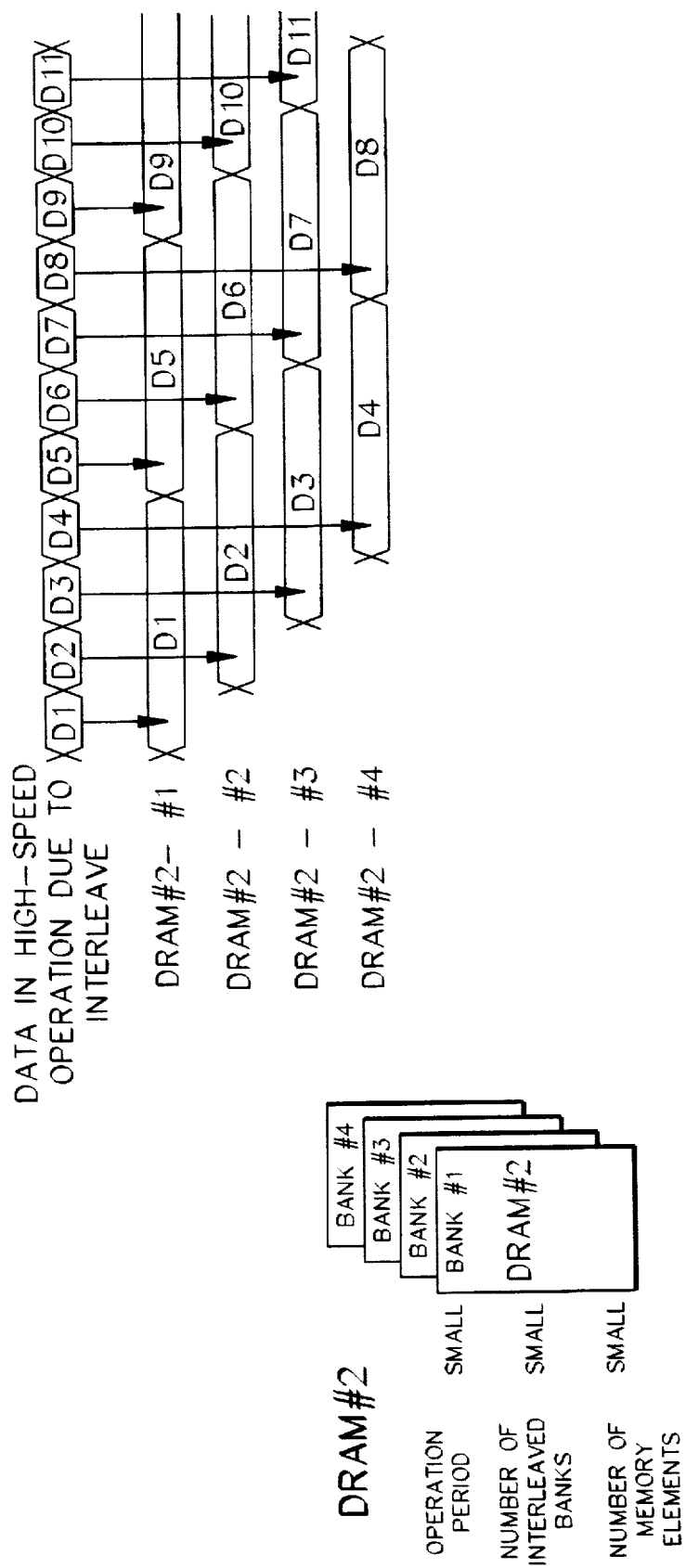
Figure 12:
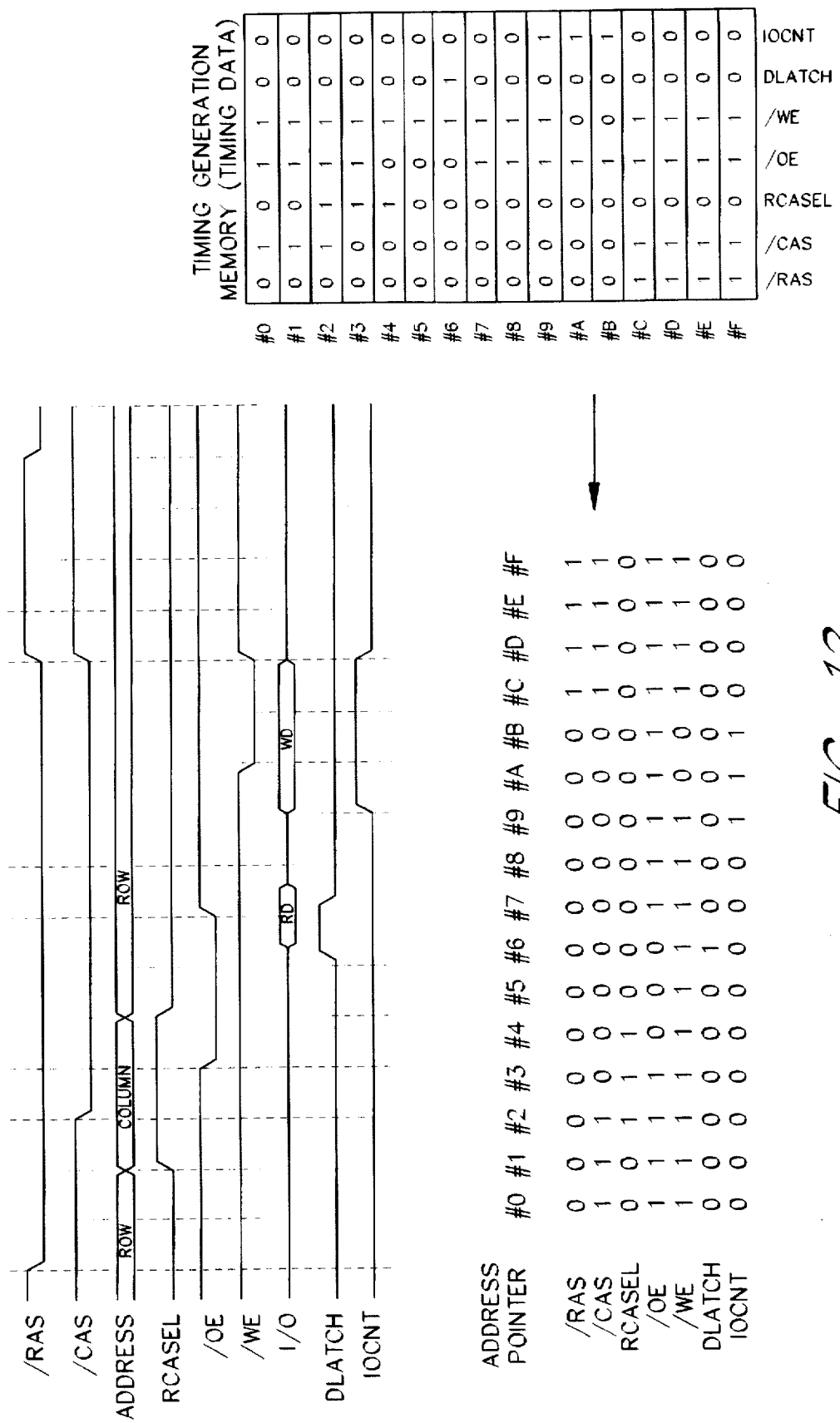
FIG. 12 is a diagram showing an example of data stored in a timing generation memory in the memory controller shown in FIG. 10 and timing signals generated by the timing generation memory.

The sequence controller 15, the program counter 16, the sequence memory 17, and the timing generation memory 18 jointly generate timing signals for controlling the DRAM 7. When a trigger signal from the failure storage trigger generator 11 or the refresh trigger generator 12 is applied to the sequence controller 15, the sequence controller 15 starts to operate the program counter 16 thereby generating address pointers for the sequence memory 17 and the timing generation memory 18. An output signal from the sequence memory 17 is supplied as sequence data to the sequence controller 15, which increments, loads, and holds the data in the program counter 16 based on the sequence data from the sequence memory 17. The timing generation memory 18 stores timing data for effecting refresh operation and failure storage operation, and generates a timing signal, as shown in FIG. 12, according to a sequence (address pointers generated by the program counter 16) that is controlled by the data in the sequence memory 17. The DRAM 7 operates in a refresh mode when it is refreshed, and in a read/modify/write mode when failure data is stored from the FIFO memory 4 into the DRAM 7. After the failure data is stored, the DRAM 7 outputs a failure storage operation end signal to the FIFO memory 4, causing the FIFO memory 4 to output the next failure data. FIG. 12 shows timing data and generated waveforms when the DRAM 7 is in the failure storage operation (read/modify/write mode). In the example shown in FIG. 12, the program counter 16 operates simply in an incremental mode. When a page flag signal 134 is of an "H" level and is applied to the sequence controller 15, the timing generation memory 18 outputs timing data in a page mode, causing the DRAM 7 to operate in the page mode. When the DRAM 7 operates in the page mode, all time failure data of one failure address (column address) is stored in the DRAM 7, the DRAM 7 outputs a one-address storage signal to enable the FIFO memory 4 to output failure data. Since the DRAM 7 cannot operate in the page mode (see FIG. 3) in an initial phase of a failure storage operation which is started by the failure storage trigger generator 11 even when the page flag signal 134 is of the "H" level and is applied to the sequence controller 15, the sequence controller 15 ignores the page flag signal 134.

The OR gate 19, the flip-flop 20, the three-state buffer 21, and the buffer 22 jointly serve as a circuit for operating the DRAM 7 in the read/modify/write mode. First, an input/output control signal IOCNT is applied to disable the three-state buffer 21, and failure data are read from the DRAM 7. The failure data from the DRAM 7 are sent through the buffer 22, and the failure data from the DRAM 7 and the failure data from the logic comparator are ORed by the OR gate 19, which applies an output signal that is latched in the flip-flop 20 by a latch signal DLATCH. Then, the three-state buffer 21 is enabled to write the data latched in the flip-flop 20 into the DRAM 7. A low/column address selection signal RCASEL is a switching signal for the multiplexer 6. When the low/column address selection signal RCASEL is "0", the multiplexer 6 selects a row address and outputs it to the DRAM 7. When the low/column address selection signal RCASEL is "1", the multiplexer 6 selects a column address and outputs it to the DRAM 7.

The failure storage signal generator 3A will be described below.

In response to a row address 121 for the DRAM 7 which is supplied from the address selector 2, the failure storage signal generator 3A effects a storage operation on the FIFO memory 4 at the same row address as the row address 121 which the banks #1~#n have stored previously. Specifically, the failure storage signal generator 3A generates storage control signals, i.e., a page flag signal 178 and a failure storage signal 179, for the memory bank to which the row address 121 from address selector 2 and the existing row address which agree with each other correspond. If the row address is a new row address, then the failure storage signal generator 3A generates storage control signals for the next memory bank not being used, and stores the new row address for a next comparison process. The failure storage signal generator 3A does not operate in non-failure cycles. The row address referred to above is a row address of the DRAM 7 in each of the banks #1~#n. The page flag signal 178 is generated for the memory bank to which the row address 121 from address selector 2 and the existing row address which agree with each other correspond.

Figure 13:
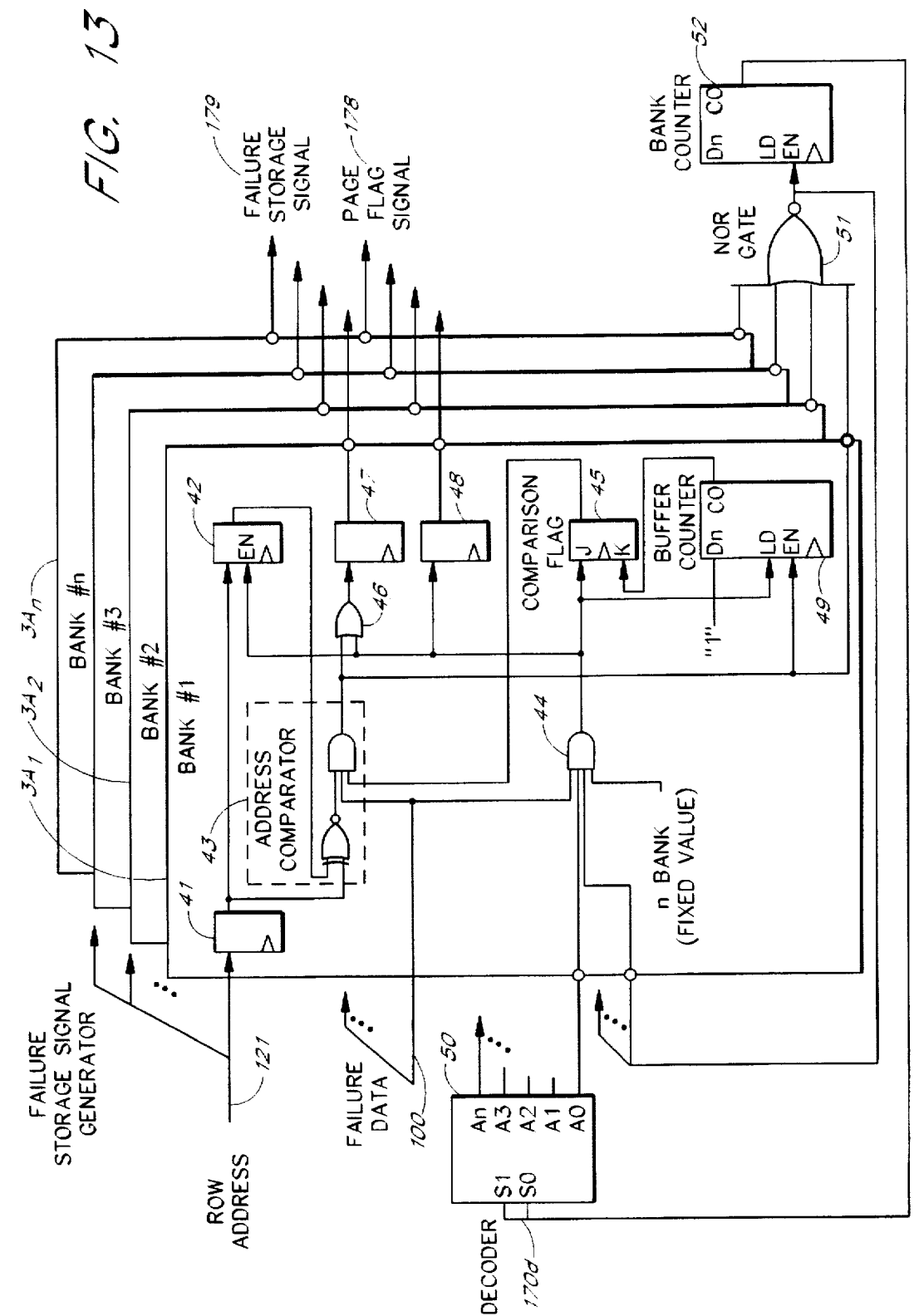
FIG. 13 is a block diagram of a failure storage signal generator in the semiconductor memory testing apparatus shown in FIG. 9.

As shown in FIG. 13, the failure storage signal generator 3A comprises failure storage signal generators $3A_1$, $3A_2$, ..., $3A_n$ associated with the respective banks #1~#n, a decoder 50, a NOR gate 51, and a bank counter 52. The failure storage signal generators $3A_1$, $3A_2$, ..., $3_n$ are of an identical structure, and each comprise address registers 41, 42, an address comparator 43, an AND gate 44, a comparison flag 45, an OR gate 46, a flip-flop 47 for generating the failure storage signal 179, a flip-flop 48 for generating the page flag signal 179, and a buffer counter 49.

Figure 14:
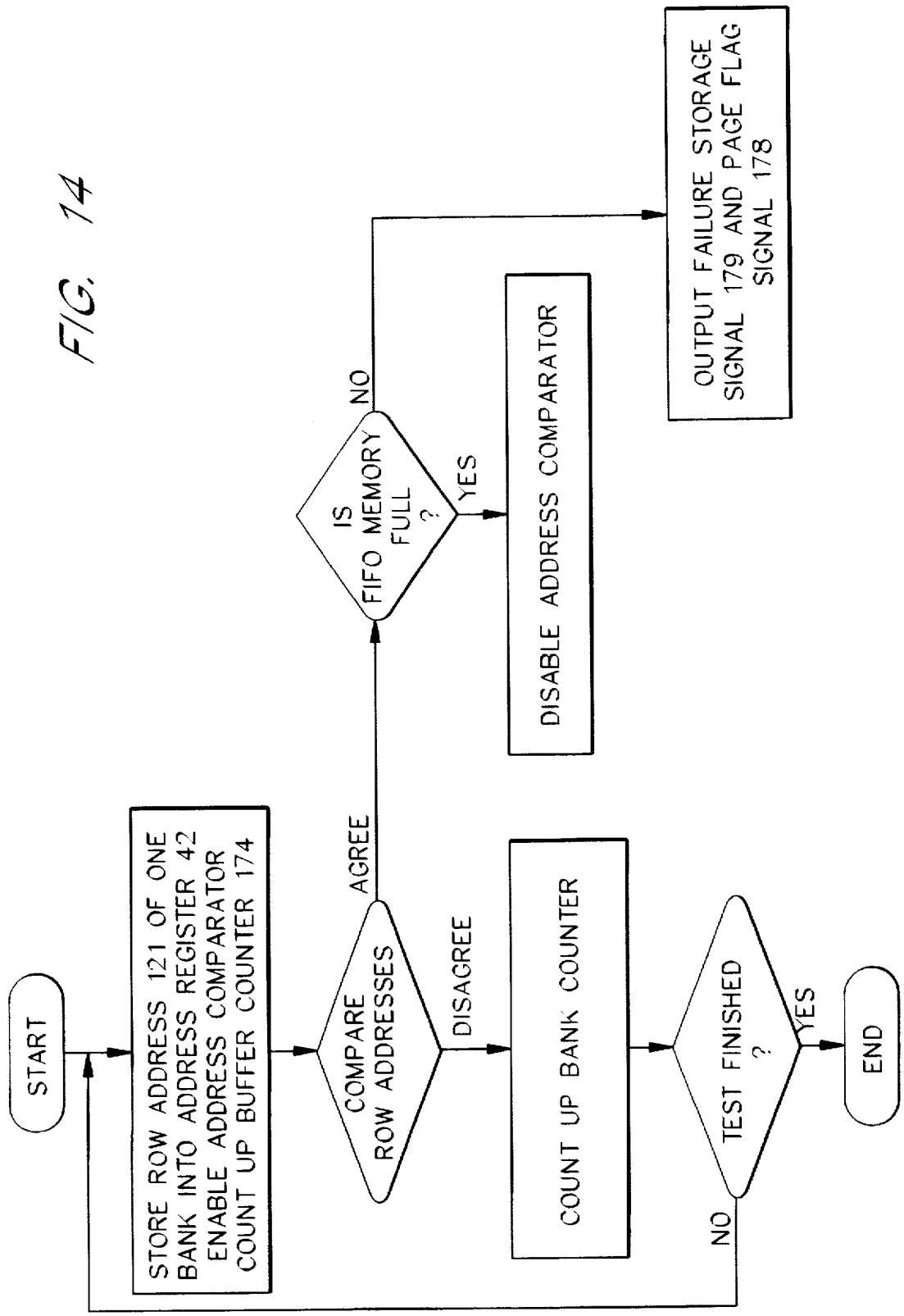
FIG. 14 is a flowchart of an operation sequence of the failure storage signal generator shown in FIG. 13.

Operation of the failure storage signal generator 3A will be described below with reference to FIG. 14.

When a semiconductor memory test is started, the failure storage signal generator 3A receives failure data 100 from the logic comparator. First, the address register 42 of the bank #1 which is selected by the decoder 50 is enabled, and the row address 121 selected by the address selector 2 is sent through the address register 41 and stored into the address register 42. The comparison flag 45 is set, enabling the address comparator 43 to compare the row addresses. The buffer counter 49 counts up, and the bank counter 52 counts up to enable the next failure storage signal generator $3A_2$ to store a different row address.

In a next failure cycle, the row addresses are compared by the address comparator 43 of the bank #1. If the compared row addresses agree with each other, then the failure storage signal generator $3A_1$ counts up the buffer counter 49, and outputs a failure storage signal 179 and a page flag signal 178 to the FIFO memory 4 of the bank #1. If the compared row addresses do not agree with each other, then the comparison flag 45 of the bank #2 is set, and the failure storage signal generator $3A_2$ operates in the same manner as the failure storage signal generator $3A_1$. Specifically, the failure storage signal generator $3A_2$ counts up the bank counter 52 and the buffer counter 49, starts comparing the row addresses of the bank #2, and outputs a failure storage signal to the FIFO memory 4 of the bank #2. In this manner, up to n different row addresses are simultaneously monitored by the failure storage signal generators $3A_1$, $3A_2$, ..., $3A_n$, and stored in the FIFO memories 4 of the corresponding row addresses.

The buffer counter 49 serves as a monitor for preventing failure data from exceeding the storage capacity of the FIFO memory under various conditions including the number of interleaved banks, a storage period for storing data into the DRAM in the high-speed page mode, etc. The buffer counter 49 normally uses as a buffer-full value a value which is smaller than the storage capacity of the FIFO memory. When the buffer counter 49 detects a buffer-full condition, it stops subsequent comparison with row addresses 121 until the number of interleaved banks is cycled, and transfers a storage operation to the next empty bank. Only when all the compared row addresses of all the banks (limited to those banks which compare row addresses) do not agree with each other, the bank counter 52 counts up and serves as a pointer for pointing to the next empty bank. When the final bank is reached, the bank counter 52 is cycled. In the example shown in FIG. 13, the bank counter 52 counts up sequentially pointing to next empty banks. However, rather than the NOR gate 51 being used, an empty bank may directly be encoded.

A bank whose buffer counter 49 is full, thereby inhibiting row address comparison will be handled as an empty bank after one cycle of operation. Specifically, if row addresses for all banks indicated by pointers of the bank counter 52 disagree, row addresses are stored again in the address register 42 of the banks and start being compared. This process is successively repeated to selectively store failure addresses of the same row address in the FIFO memory 4 of each of the banks. In the example shown in FIG. 13, a buffer-full condition is detected by the buffer counter 49. However, if desired, a write completion signal from the memory controller 5, indicative of a completion of data writing into the DRAM 7, may be received for thereby forcibly turning its own bank to an empty bank for use. In the above operation, the FIFO memory 4 stores addresses and a page flag at the same row address. Because of the same row address, failure data can be stored from the FIFO memory 4 into the DRAM 4 in a high-speed page mode (or a hyperpage mode). Accordingly, failure data can be stored into the DRAM 4 at a high speed. As a consequence, the number of interleaved banks may be reduced, and the cost of the circuit arrangement of the semiconductor memory testing apparatus may correspondingly be reduced.

Figure 2:
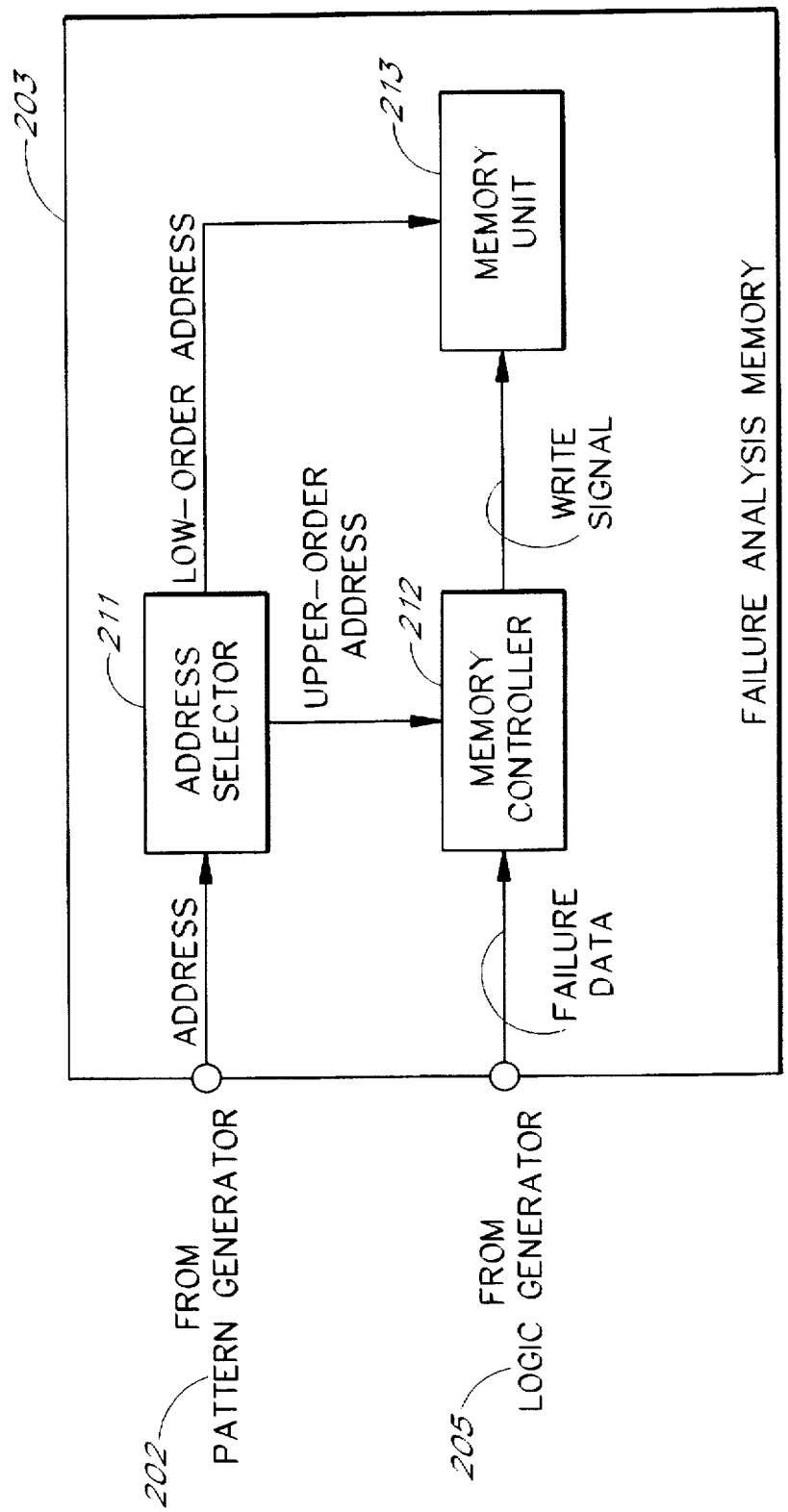
FIG. 2 is a detailed block diagram of a failure analysis memory of the conventional semiconductor memory testing apparatus shown in FIG. 1.
Figure 15:
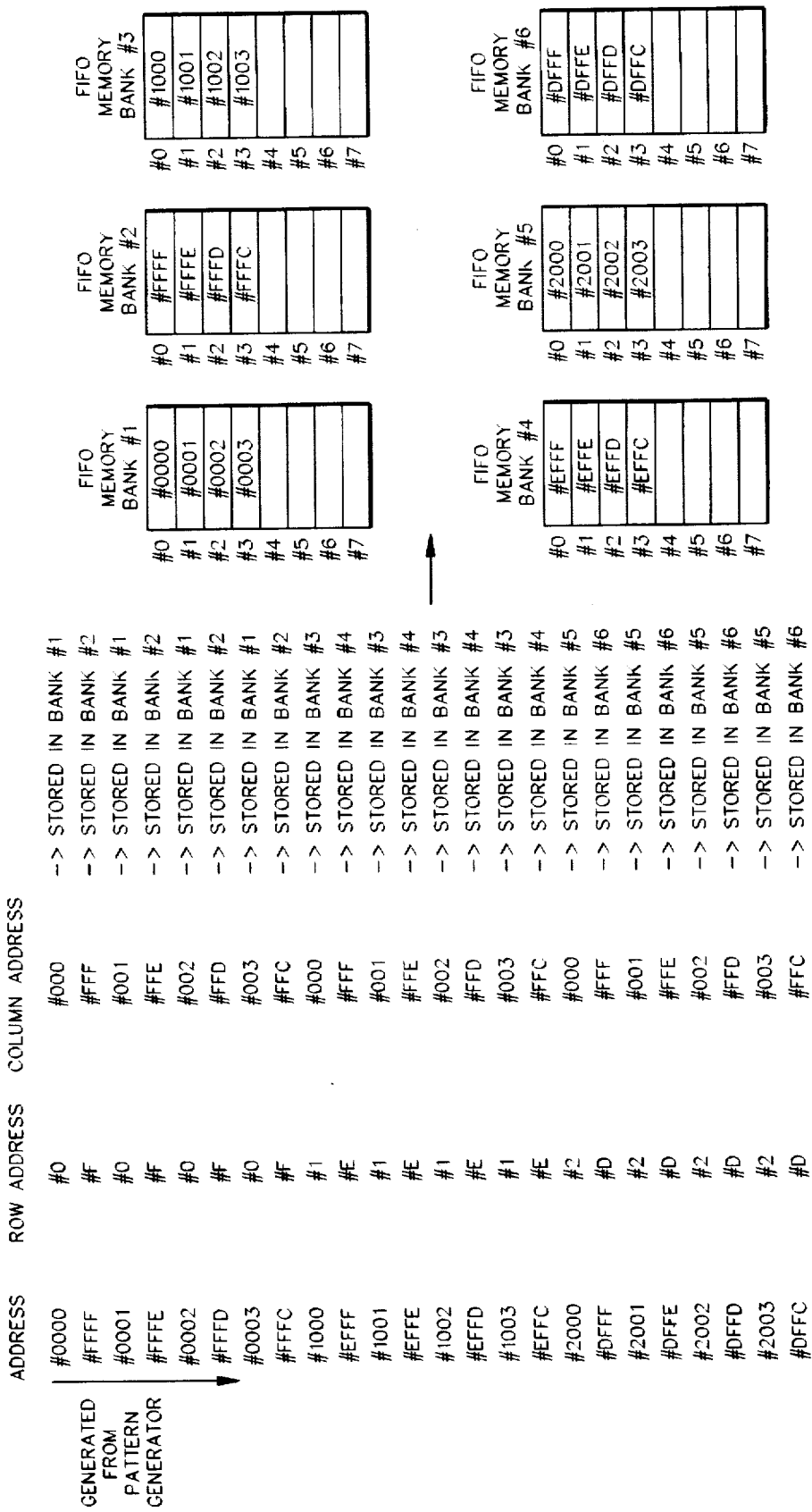
FIG. 15 is a diagram showing an example of address data which are stored in FIFO memories in the semiconductor memory testing apparatus shown in FIG. 9 after a memory test has started.

An example of address data stored into each FIFO memory 4 from the start of the semiconductor memory test is shown in FIG. 15. It is assumed that random address signals generated by a pattern generator, similar to the pattern generator 202 shown in FIG. 1, are in a failure cycle and all under failure conditions, and read into the FIFO memory 4. It is also assumed that the failure address from the pattern generator is of 16 bits, with its low-order 12 bits assigned as a column address for a memory unit, similar to the memory unit 213 shown in FIG. 2, and its upper-order 4 bits assigned as a row address. FIG. 15 shows the manner in which addresses of the same row address are stored into the FIFO memory 4 of each of the banks in the above operation.

Specifically, the bank counter 52 shown in FIG. 13 first points to the bank #1 as an initial value, disabling the comparison flag. An address #0000 of a row address #0 is stored into the FIFO memory 4 of the bank #1. Then, when an address #FFFF of a row address #F comes, since the row address does not agree with the row addresses of any banks, it is stored into the FIFO memory 4 of the bank #2. When an address #0001 comes, since the row address agrees with the row address of the bank #1, it is stored into the FIFO memory 4 of the bank #1. In this manner, addresses #0000, #0001, #0002, #0003 are stored into the memory 4 of the bank #1, and addresses #FFFF, #FFFE, #FFFD, #FFFC are stored into the FIFO memory 4 of the bank #2. Similarly, addresses are stored into the FIFO memories 4 of the other banks #3–#6.

Thus, addresses of the same row address are stored into the FIFO memories 4 of the corresponding banks. As a result, the DRAM 7 can store failure data in the high-speed page mode (or the hyperpage mode).

In the above embodiment, the FIFO memory 4 is employed in each of the banks. However, if desired, other temporary buffer means which performs the same first-in, first-out function as the FIFO memories may be employed. For example, register files or small-capacity SRAMs and address counters may be employed.

In the above embodiment, furthermore, failure data are written into the DRAM in the read/modify/write mode. However, a write-per-bit-mode DRAM having a write control function per I/O data pin may be employed. Use of such a write-per-bit-mode DRAM is effective in shortening a time required to read data therefrom.

Figure 16:
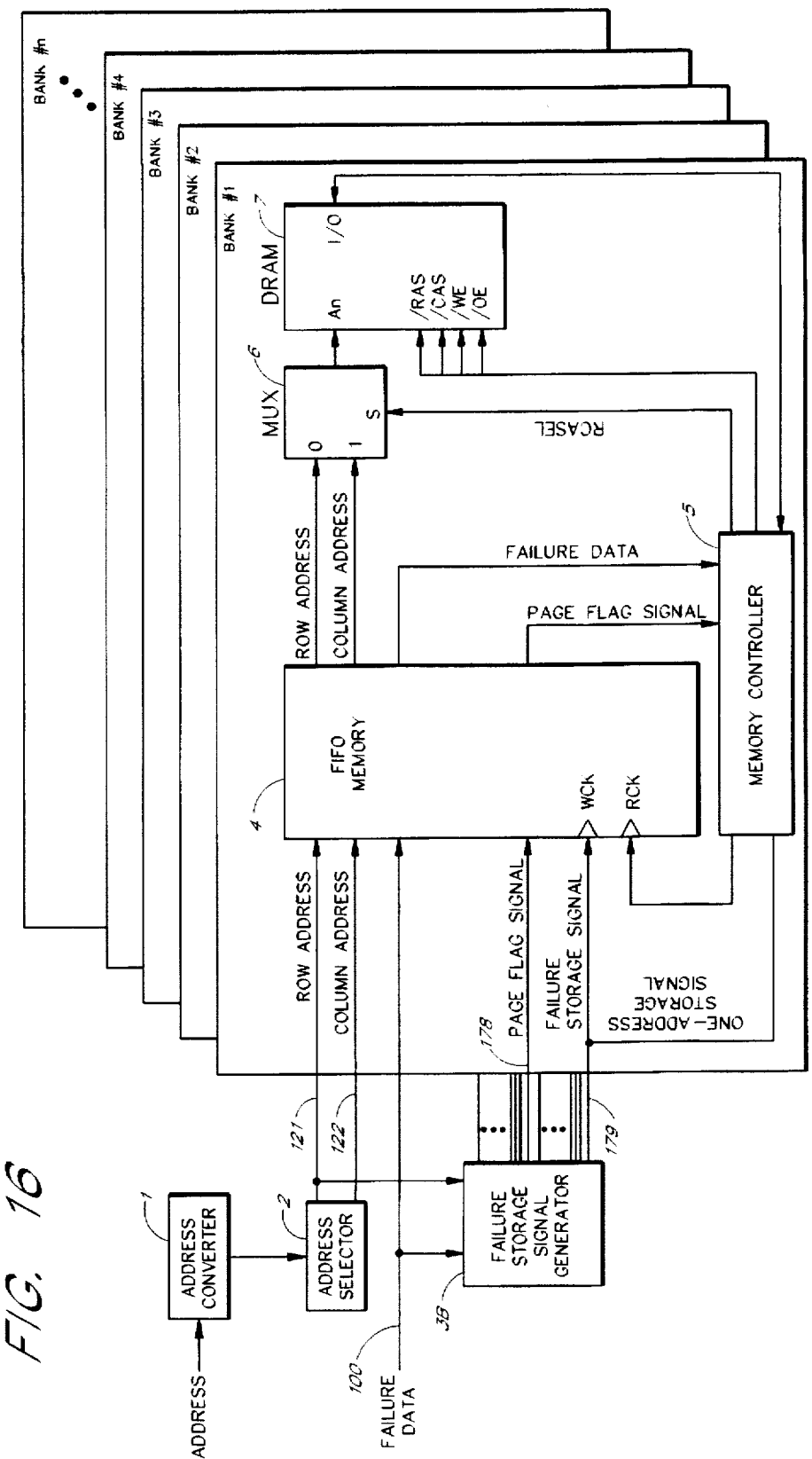
FIG. 16 is a block diagram of a failure analysis memory of a semiconductor memory testing apparatus according to a second embodiment of the present invention.

FIG. 16 shows in block form a failure analysis memory of a semiconductor memory testing apparatus according to a second embodiment of the present invention. The failure analysis memory of the semiconductor memory testing apparatus according to the second embodiment differs from the failure analysis memory of the semiconductor memory testing apparatus according to the first embodiment in that an address converter 1 is added and a different failure storage signal generator 3B is employed.

Figure 17:
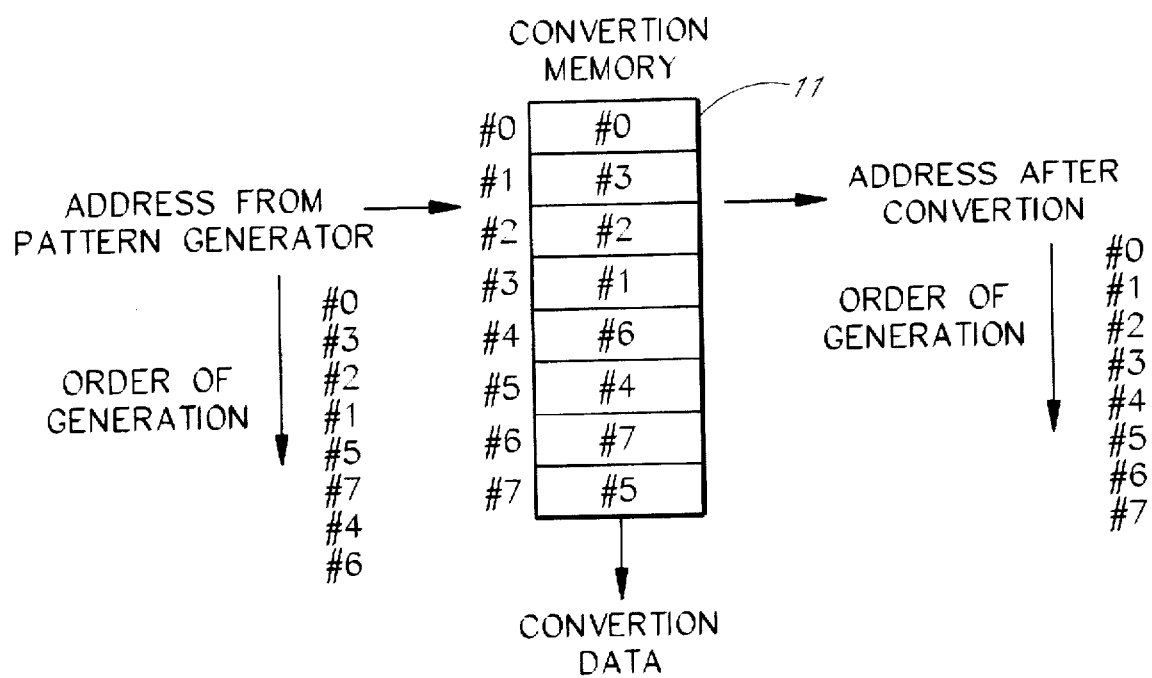
FIG. 17 is a diagram showing an example of an address conversion process carried out by an address converter in the semiconductor memory testing apparatus shown in FIG. 16.

The address converter 1 shown in FIG. 16 serves to convert random addresses from the pattern generator into serial addresses. As shown in FIG. 17, when the pattern generator successively outputs random addresses #0, #3, #2, #1, #5, #7, #4, #6, these random addresses are supplied to a conversion memory 11 in the address converter 1, which then successively outputs serial addresses #0, #1, #2, #3, #4, #5, #6, #7.

Figure 18:
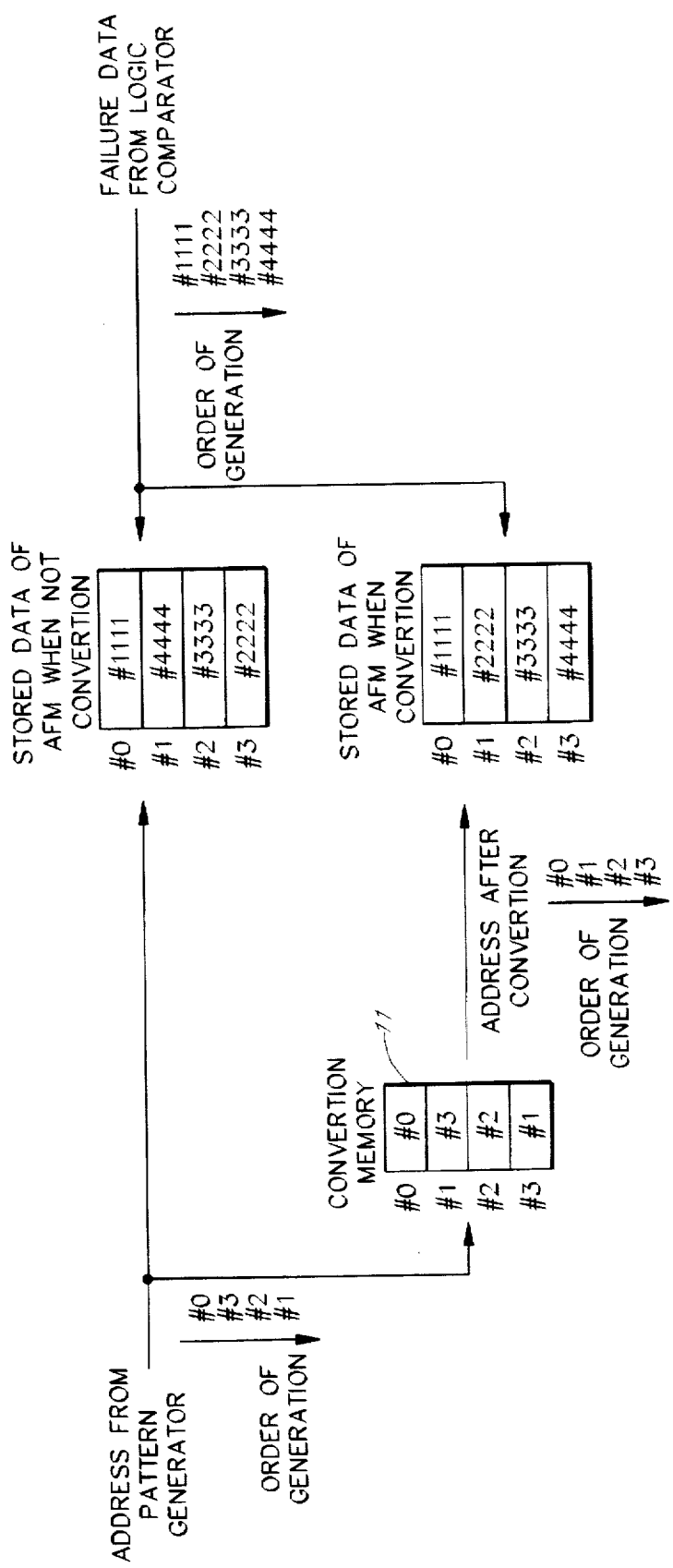
FIG. 18 is a diagram illustrative of the manner in which addresses for storing failure data change their positions when the addresses are converted by a conversion memory from the positions when the addresses are not converted thereby.
Figure 19:
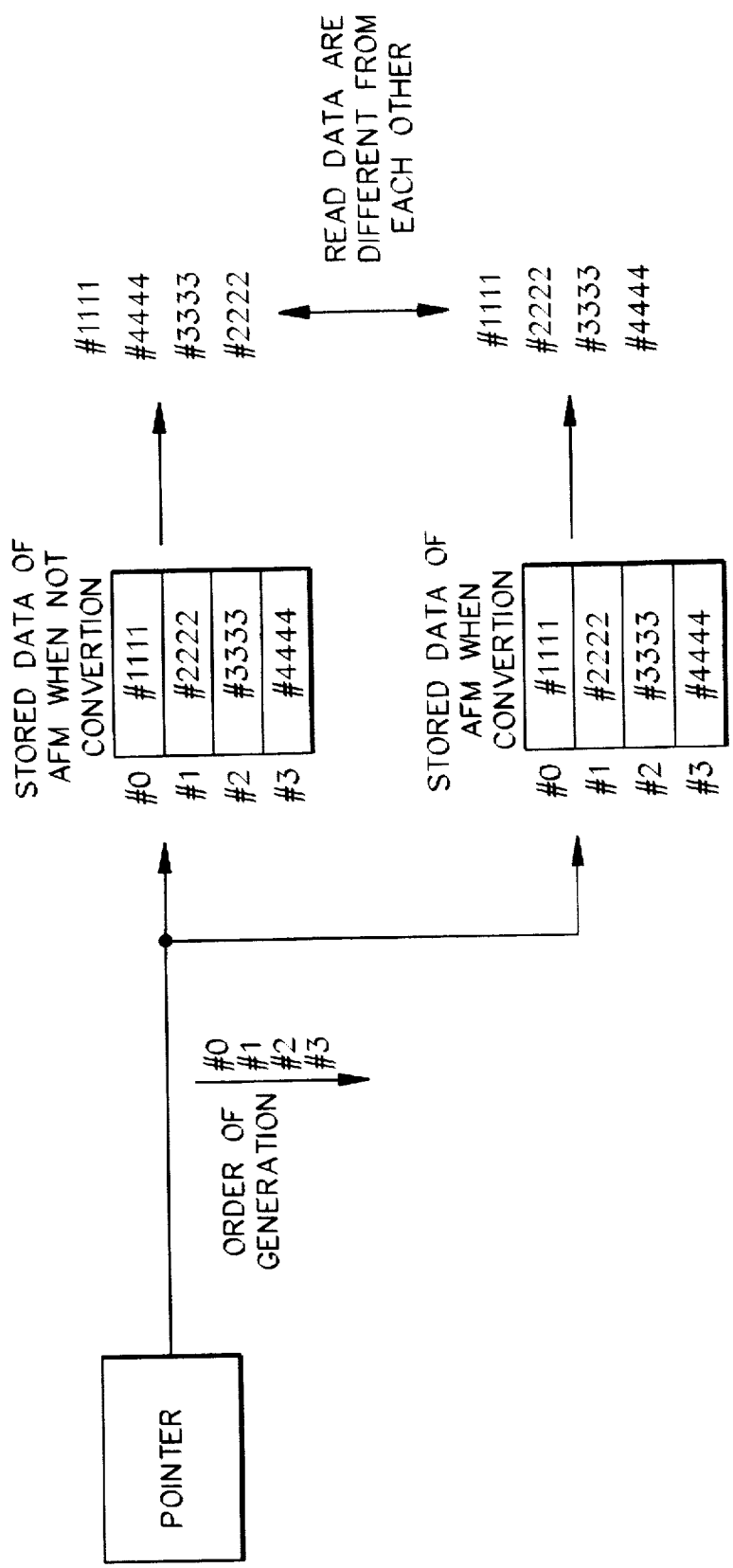
FIG. 19 is a diagram illustrative of the manner in which failure data read from a failure analysis memory when the addresses are converted differs from data read from the failure analysis memory when the addresses are not converted.
Figure 20:
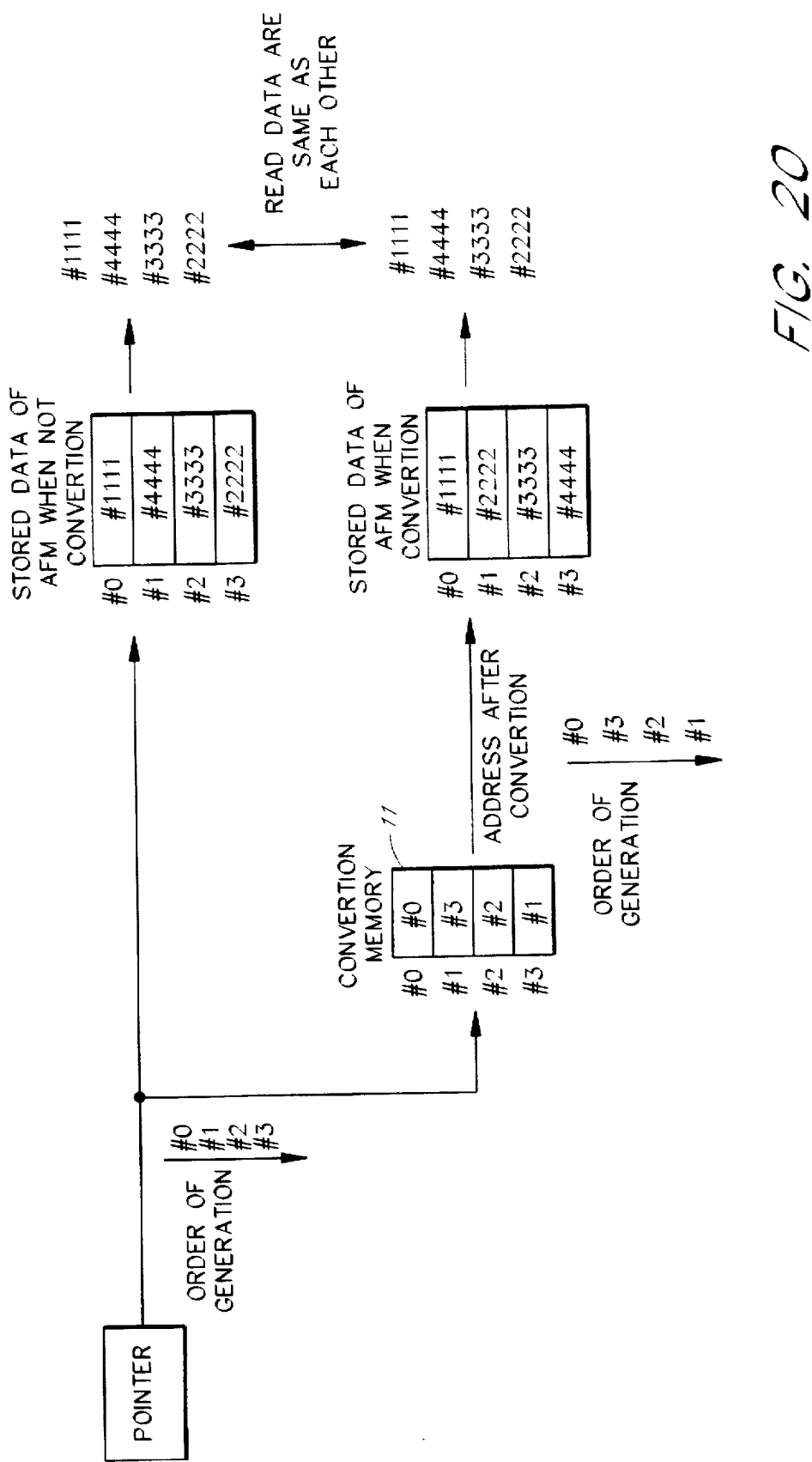
FIG. 20 is a diagram illustrative of the manner in which the same failure information can be read regardless of whether pointers of the failure analysis memory are subjected to an address conversion or not.

With the conversion memory 11 being used, addresses for storing failure data change their positions when the addresses are converted by the conversion memory 11 from the positions when the addresses are not converted thereby, as shown in FIG. 18. When failure data in the failure analysis memory are-analyzed (mainly in a read mode of operation of the failure analysis memory), pointers in the failure analysis memory are used. If the pointers are used as they are, failure information which is read from the failure analysis memory when the addresses are converted differs from failure information which is read when the addresses are not converted, as shown in FIG. 19. Since the pointers in the failure analysis memory and the addresses (not converted) from the pattern generator are related to each other in a 1 to 1 correspondence (failure information at the same address as the semiconductor memory under test could not be read if they were not in a 1 to 1 correspondence), the failure information which is not converted is correct failure information. Therefore, when the addresses are converted by the conversion memory 11, the positions of the addresses of the failure analysis memory are changed, failing to read failure information in the positions of correct addresses. This drawback is eliminated as follows: As shown in FIG. 20, when the addresses are converted by the conversion memory 11, pointers for generating addresses for reading failure information in the failure analysis memory are also passed through and converted by the conversion memory 11, and the failure information is read using the converted pointers. In this manner, the same failure information can be read irrespective of whether the addresses are converted or not. Therefore, even when the addresses are converted by the conversion memory 11 for storing failure data, normal failure information can be read.

The address selector 2 outputs row and column addresses 121, 122 using addresses from the pattern generator, as described above with reference to the first embodiment.

The FIFO memory 4 serves to temporarily store addresses and failure data because the DRAM 7 cannot store data while operating in a refresh mode (for holding data).

Figure 21:
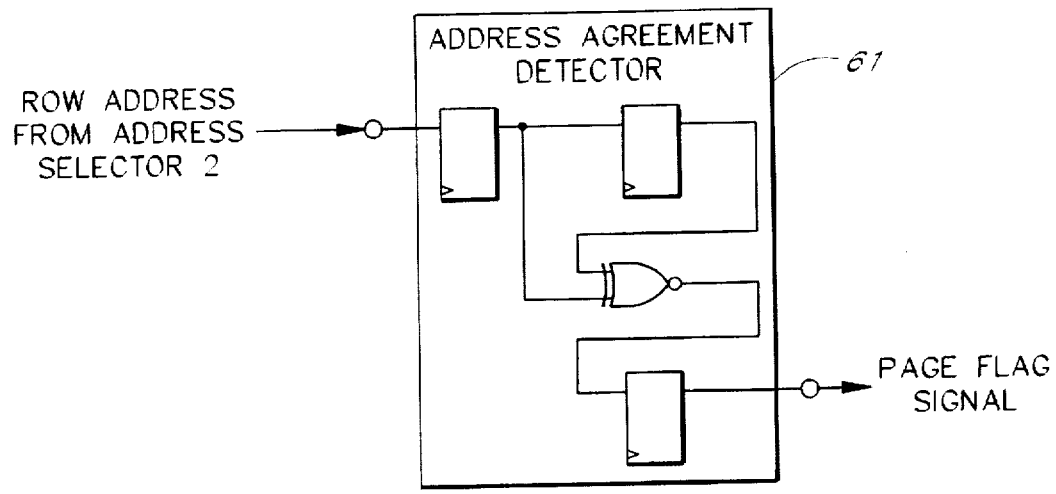
FIG. 21 is a block diagram of a failure storage signal generator in the semiconductor memory testing apparatus shown in FIG. 16.
Figure 21:
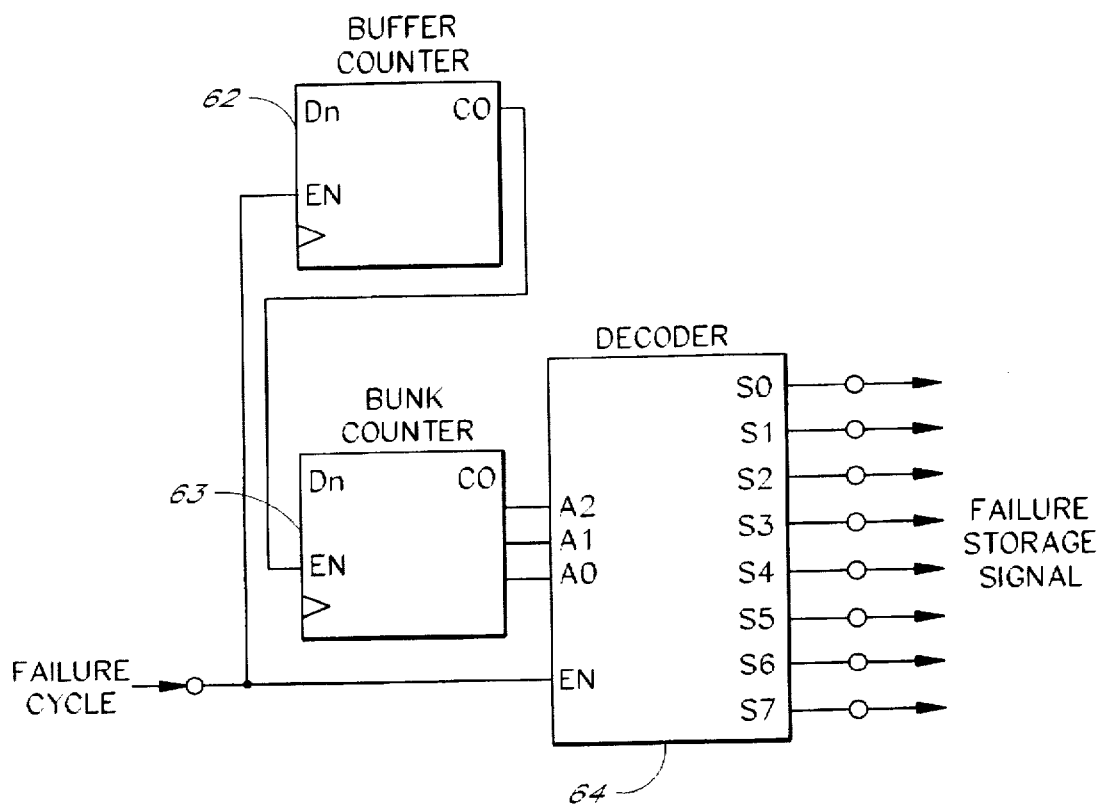

As shown in FIG. 21, the failure storage signal generator 3B comprises an address agreement detector 61, a buffer counter 62, a bank counter 63, and a decoder 64. The address agreement detector 61 detects agreement between row addresses 121 outputted in previous and present cycles from the address selector 2. If the row addresses 121 in previous and present cycles agree with each other, then the address agreement detector 61 outputs a page flag signal 178. The buffer counter 62 has a count of the same depth as the FIFO memory 4, and counts up in each failure cycle to a maximum count, whereupon it returns to "0". When the buffer counter 62 counts up to the maximum count, the bank counter 63 decides that one FIFO memory 4 is full, and counts up. The decoder 64 decodes the count of the bank counter 63, and generates and outputs a failure storage signal to the bank which is designated by the count of the bank counter 63.

When the address converter 1 can generate serial addresses with respect to the failure analysis memory, since the row address does not randomly change, the failure storage signal generator 3B keeps outputting the page flag signal, causing the memory controller 5 to store failure data into the DRAM 7 in the page mode. It is thus possible to operate the DRAM 7 in the page mode by converting random addresses into serial addresses.

Figure 22:
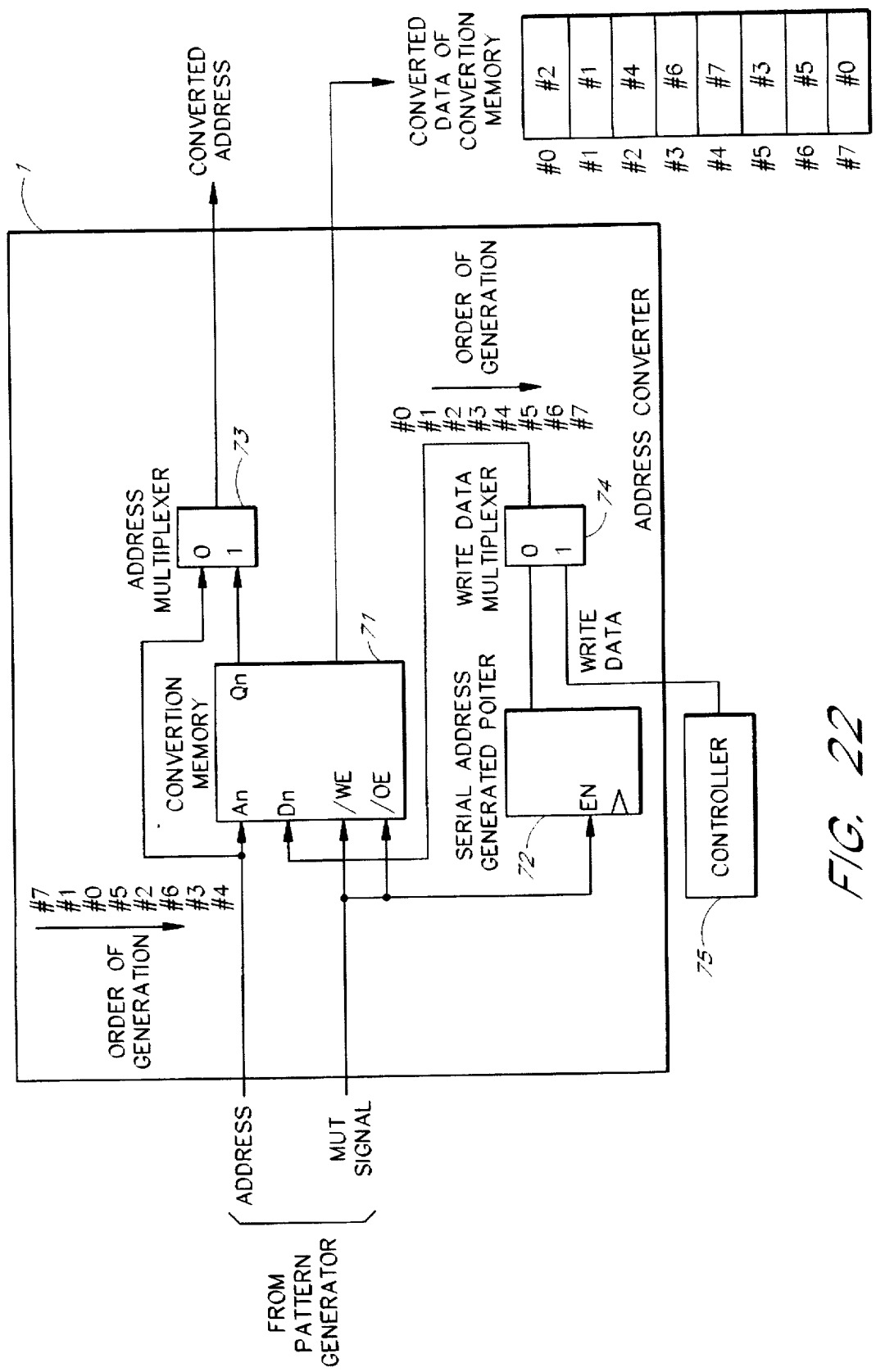
FIG. 22 is a block diagram of the address converter in the semiconductor memory testing apparatus shown in FIG. 16.
Figure 23:
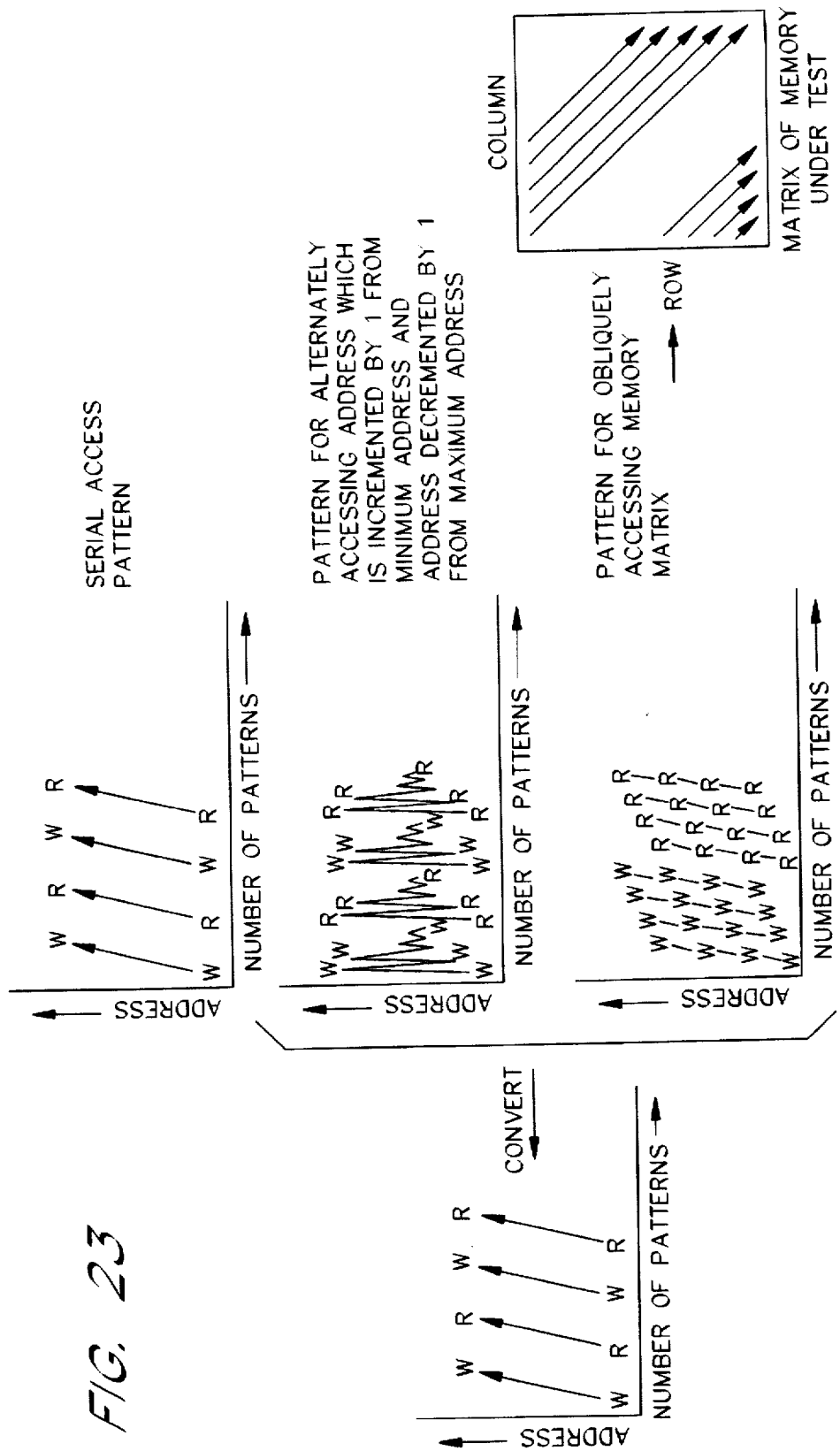
FIG. 23 is a diagram illustrating the manner in which the semiconductor memory testing apparatus shown in FIG. 16 operates.

FIG. 22 shows in block form the address converter 1 which generates converted data through a hardware arrangement. The address converter 1 converts random addresses from the pattern generator into serial addresses such as serial addresses #0, #1, #2, . . . . As shown in FIG. 22, the address converter 1 comprises a conversion memory 71, a serial address generating pointer 72, an address multiplexer 73, and a write data multiplexer 74. The serial address generating pointer 72 successively generates write data, e.g., write data #0, #1, #2, . . . , #7, for the conversion memory 71 in response to a MUT (Memory Under Test) signal from the pattern generator. The write data multiplexer 74 selects either write data sent from a controller 75 which controls operation of the semiconductor memory testing apparatus or the write data outputted from the serial address generating pointer 72. When a MUT signal indicative of a write and address signals #7, #1, #0, #5, #2, #6, #3, #4 are outputted from the pattern generator, the conversion memory 71 stores data #0, #1, #2, #3, #4, #5, #6, #7 successively outputted from the write data multiplexer 74 into respective addresses #7, #1, #0, #5, #2, #6, #3, #4. Specifically, the conversion memory 71 operates in a read mode in response to the MUT signal from the pattern generator. When the address signals #7, #1, #0, #5, #2, #6, #3, #4 are successively inputted to the conversion memory 71, the conversion memory 71 successively output the data #0, #1, #2, #3, #4, #5, #6, #7. As a result, the random addresses from the pattern generator are converted into the serial addresses. The address multiplexer 73 serves to select unconverted addresses (random addresses) from the pattern generator or converted addresses (serial addresses) outputted from the conversion memory 71. When in a serial access pattern test, the address multiplexer 73 selects unconverted addresses.

The above series of steps of operation is written into an instruction memory which controls the pattern generator. Generation of a test address pattern, incrementing of the serial address generating pointer 72, and storage of serial addresses are controlled by using addresses from an address generator in the pattern generator and the MUT signal (control signals /RAS, /CAS, /WE, /OE, etc. for the memory under test) from a MUT signal generator in the pattern generator.

As described above, serial addresses are generated by an address conversion carried out by the conversion memory 71, and addresses of the same row address and a page flag are stored into the FIFO memory 4. Thus, failure data are stored from the FIFO memory 4 into the DRAM 7 in the page mode. Since failure data can be stored into the DRAM 7 at a high speed, the number of interleaved banks may be reduced, and the number of memory elements used in the failure analysis memory reduced. Furthermore, converted data can easily be generated.

Figure 24:
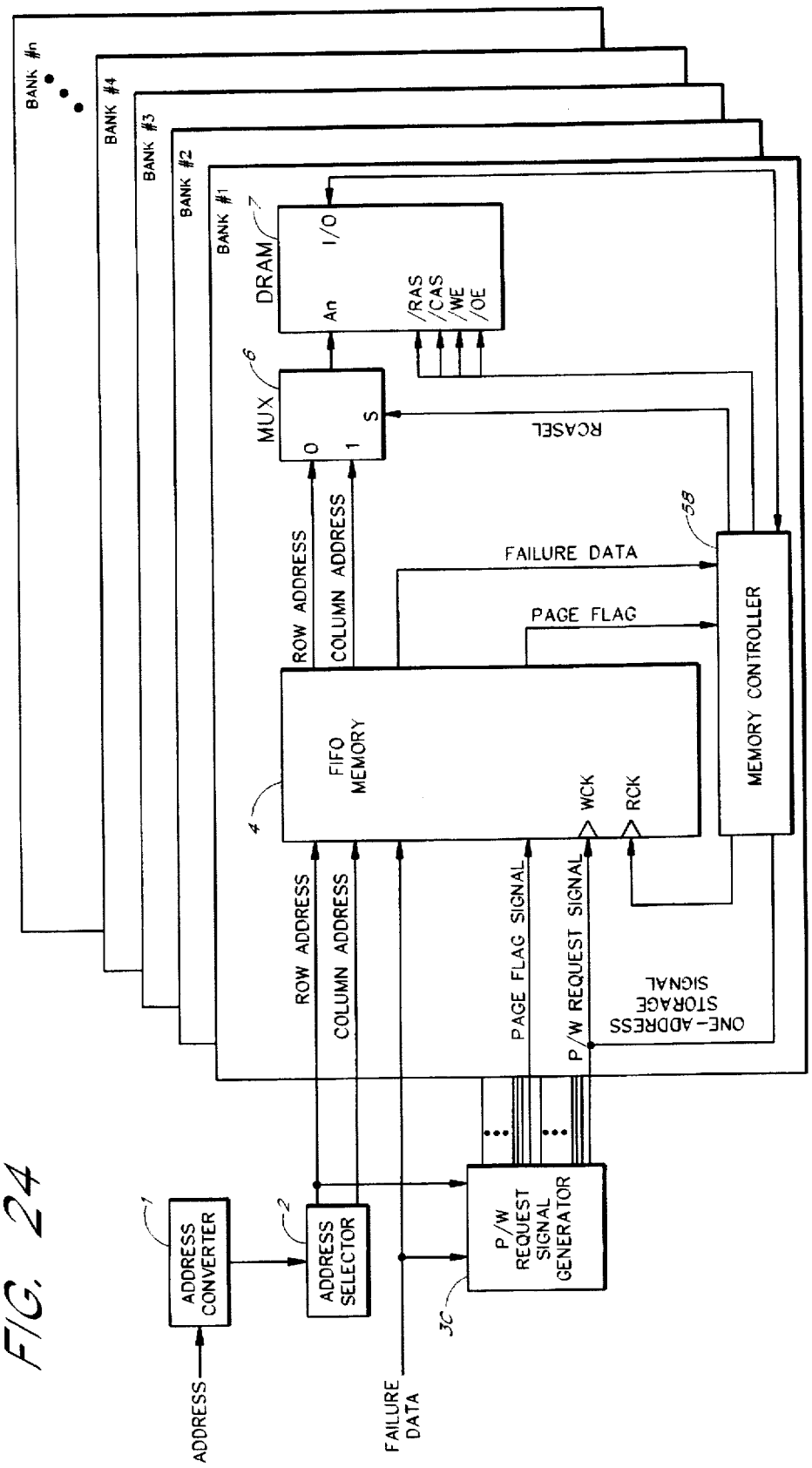
FIG. 24 is a block diagram of a failure analysis memory of a semiconductor memory testing apparatus according to a third embodiment of the present invention.

FIG. 24 shows in block form a failure analysis memory of a semiconductor memory testing apparatus according to a third embodiment of the present invention. The failure analysis memory of the semiconductor memory testing apparatus according to the third embodiment differs from the failure analysis memory of the semiconductor memory testing apparatus according to the second embodiment in that the failure storage signal generator 3B according to the second embodiment is replaced with a R/W request signal generator 3C.

The R/W request signal generator 3C serves to detect agreement between row addresses outputted in previous and present cycles from the address selector 2. If the row addresses in previous and present cycles agree with each other, then the R/W request signal generator 3C outputs a page flag signal, and also outputs a R/W request signal to the FIFO memory 4 of each bank when failure data is to be stored and read.

Figure 25:
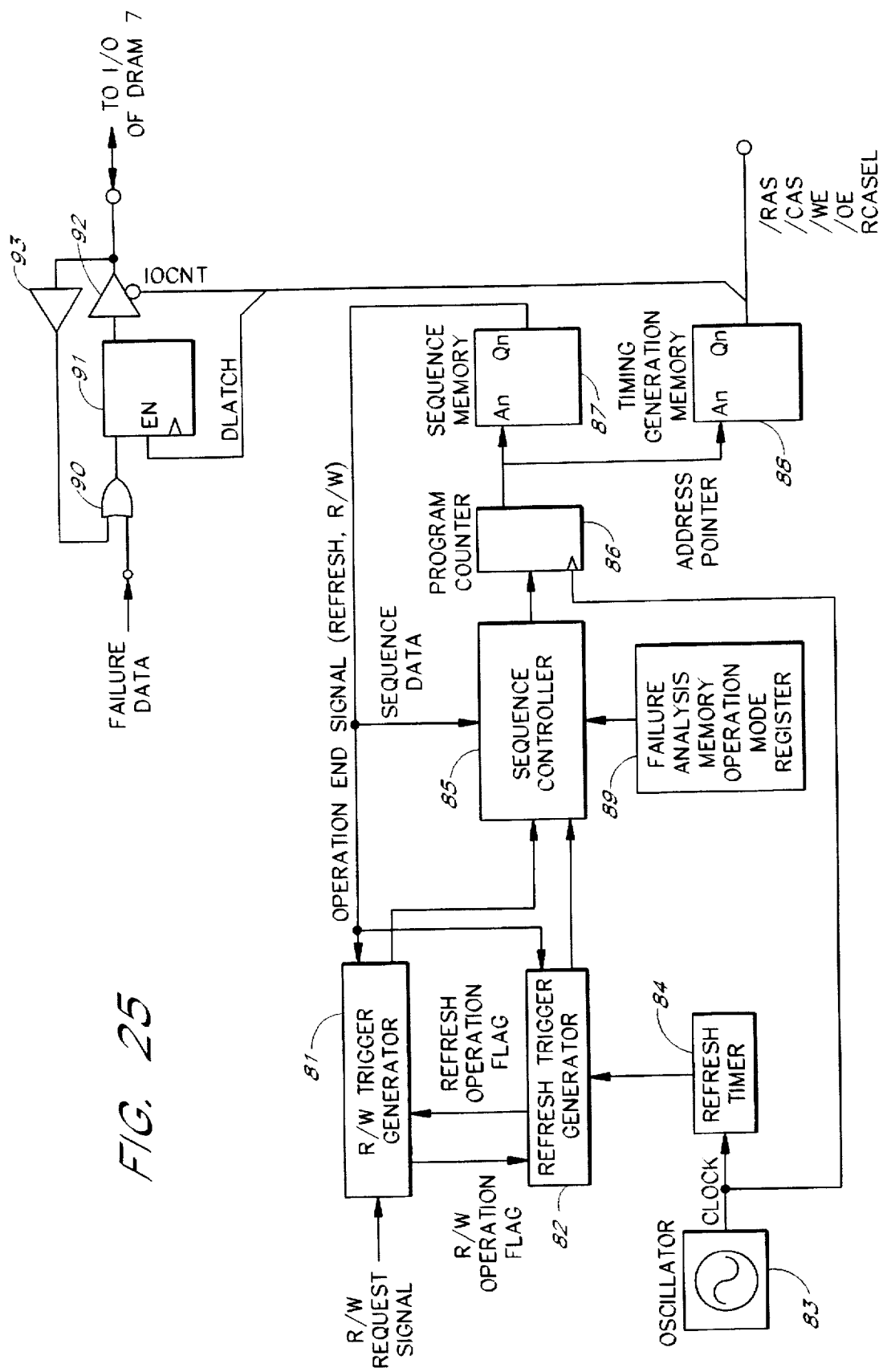
FIG. 25 is a block diagram of a memory controller in the semiconductor memory testing apparatus shown in FIG. 24.

A memory controller 58 serves to control the DRAM 7 in each bank. As shown in FIG. 25, the memory controller 58 comprises a R/W trigger generator 81, a refresh trigger generator 82, an oscillator 83, a refresh timer 84, a sequence controller 85, a program counter 86, a sequence memory 87, a timing generation memory 88, a failure analysis memory operation mode register 89, an OR gate 90, a D flip-flop 91, a three-state buffer 92, and a buffer 93.

When a R/W (Read/Write) request signal is applied to the R/W trigger generator 81 in each mode of operation of the failure analysis memory, the R/W trigger generator 81 starts a read or write mode of operation of the DRAM 7. In each mode of operation of the failure analysis memory, operation of the DRAM 7 (in write, read, page, and other modes) is started.

The refresh trigger generator 82 starts a refresh operation in response to a refresh request from the refresh timer 84. In the R/W operation or the refresh operation, the trigger generators 81, 82 output a R/W operation flag and a refresh operation flag, respectively, to the other trigger generators 82, 81 to hold either one of the W/R operation and the refresh operation in a wait state so that the R/W operation and the refresh operation will not compete with each other. When an operation end signal is supplied from the sequence memory 87, one of the R/W operation flag and the refresh operation flag is dropped, starting the operation which has been held in the wait state. The refresh timer 84 measures time with a clock signal supplied from the oscillator 83. When a refresh time for one address (=refresh time of the DRAM 7/refresh cycle of the DRAM 7) is reached, the refresh timer 84 outputs a refresh request signal to the refresh trigger generator 82. The refresh time of the DRAM 7 is a period of time during which the DRAM 7 can hold data without being refreshed. If the DRAM 7 is not refreshed within the refresh time, the data stored in the DRAM 7 is eliminated. The refresh cycle of the DRAM 7 is the number of refreshes to be made within the refresh time, and depends on the number of row addresses of the DRAM 7. If the DRAM 7 is not refreshed as many times as the refresh cycle within the refresh time, the data stored in the DRAM 7 is eliminated.

Figure 26:
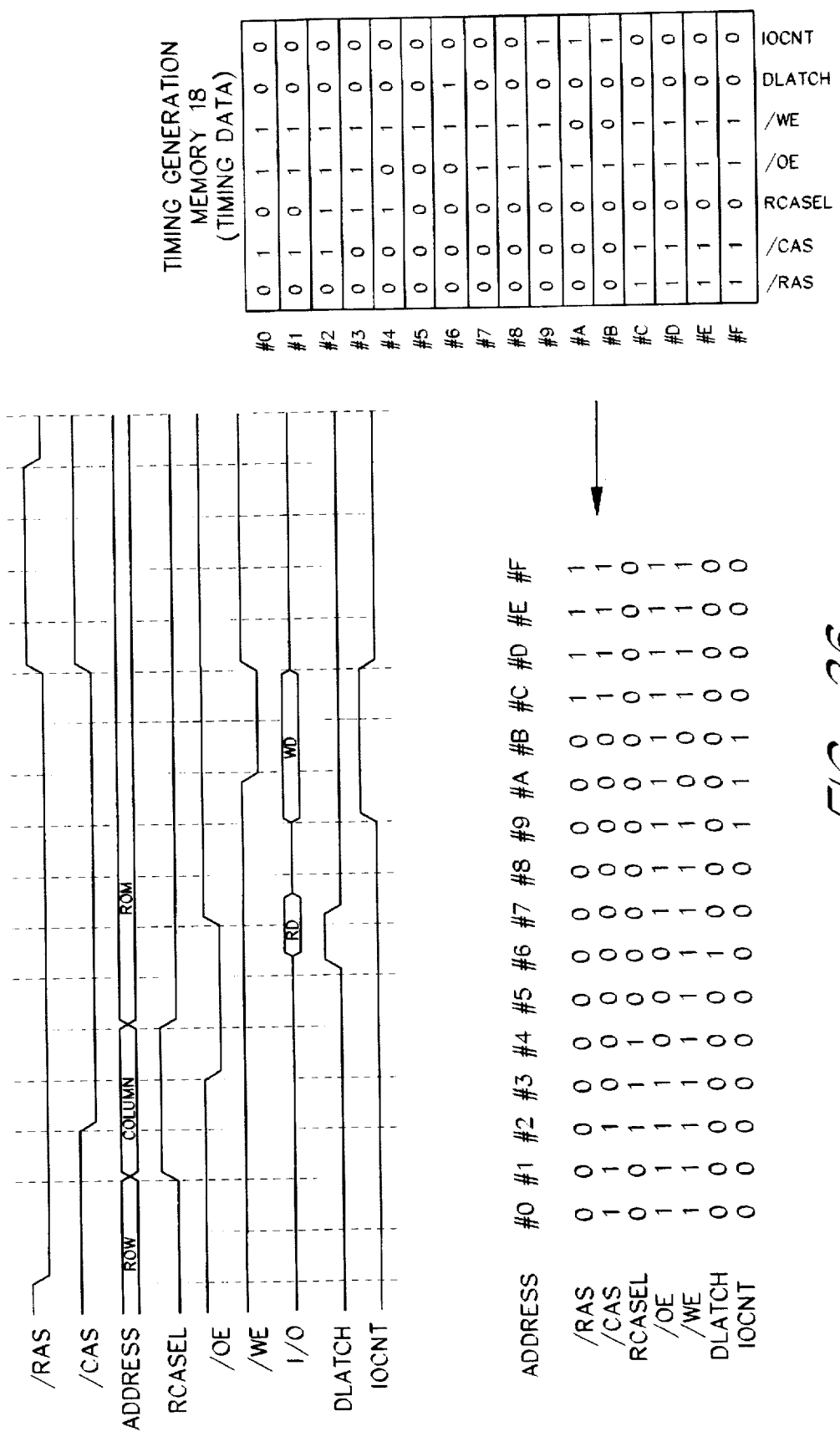
FIG. 26 is a diagram showing timing data and generated waveforms in a failure storage operation.

The sequence controller 85, the program counter 86, the sequence memory 87, and the timing generation memory 88 jointly generate timing signals for controlling the DRAM 7. When a trigger signal from the R/W trigger generator 81 or the refresh trigger generator 82 is applied to the sequence controller 85, the sequence controller 85 loads a start address into the program counter 86, starting operate the program counter 86 thereby generating addresses for the sequence memory 87 and the timing generation memory 88. An output signal from the sequence memory 87 is supplied to the sequence controller 85, which increments, loads, and holds the data in the program counter 86 based on the sequence data from the sequence memory 87. The timing generation memory 88 stores timing data for effecting refresh operation and R/W operation, and generates a timing signal, as shown in FIG. 26, according to a sequence (addresses generated by the program counter 86) that is controlled by the data in the sequence memory 87. The DRAM 7 operates in a refresh mode when it is refreshed, and in a read mode, a write mode, and a read/modify/write mode when in each operation mode. FIG. 26 shows timing data and generated waveforms when the DRAM 7 is in the failure storage operation (read/modify/write mode). In the example shown in FIG. 26, the program counter 86 operates simply in an incremental mode.

Figure 27:
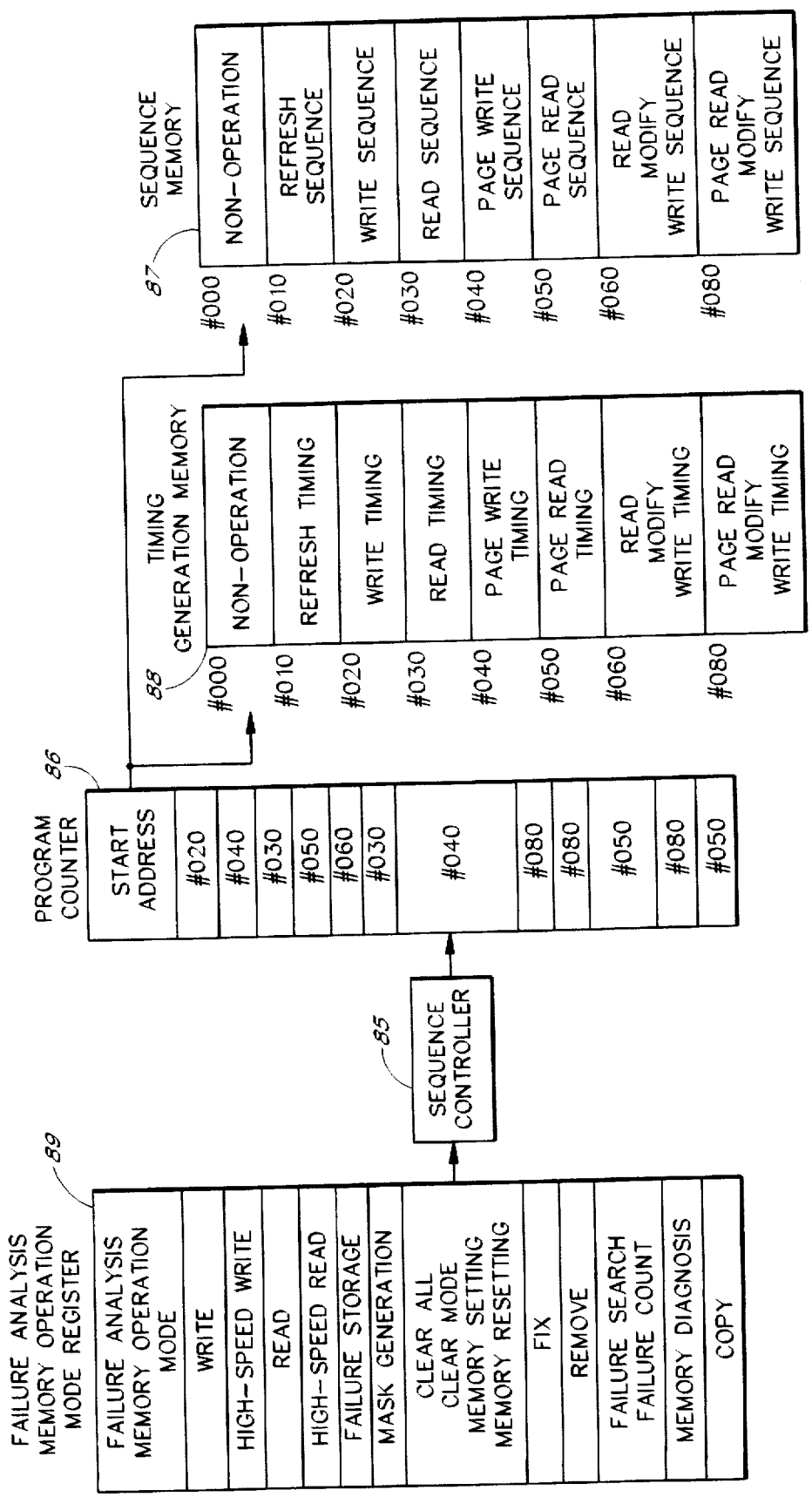
FIG. 27 is a diagram showing data stored in a sequence memory and a timing generation memory in the memory controller shown in FIG. 25 when operation of a DRAM is controlled in various operation modes of the failure analysis memory.

Timing data shown in FIG. 27 is stored in the timing generation memory 88. The timing generation memory 88 can generate timing signals for controlling the operation modes of the DRAM 7 by changing start addresses to be loaded into the program counter 86.

In this manner, the operation of the DRAM 7 can be controlled in each of the operation modes of the failure analysis memory. As shown in FIG. 27, start addresses are generated by the sequence controller 85 under the control of the failure analysis memory operation mode register 89.

Figure 28:
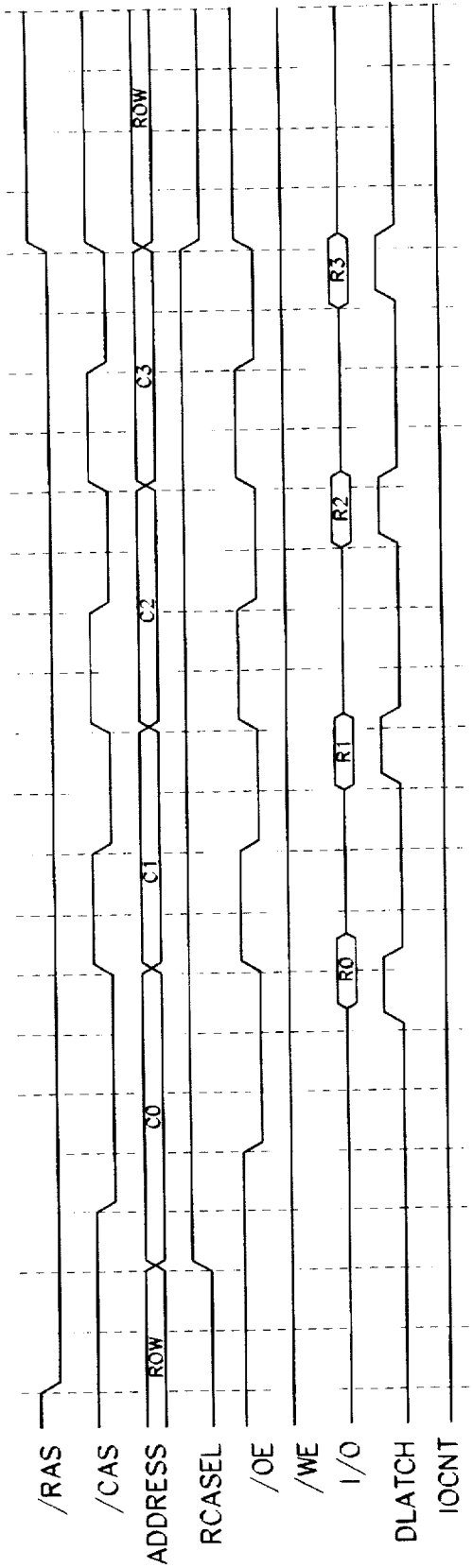
FIG. 28 is a timing chart of operation of the DRAM when the failure analysis memory operates in a page read mode.

Since sequence data vary from operation mode to operation mode of the DRAM 7, the sequence memory 87 stores therein sequence data corresponding to the timing data stored in the timing generation memory 88 as shown in FIG. 27. When the DRAM 7 operates in a page mode, since certain time data are repeated over a certain interval, the sequence data stored in the sequence memory 87 include a jump sequence. A page read mode of operation is shown as an example in FIG. 28. In this example, the sequence memory 87 stores a load signal for the program counter 86 at an address #A and load data at an address #7.

Figure 29:
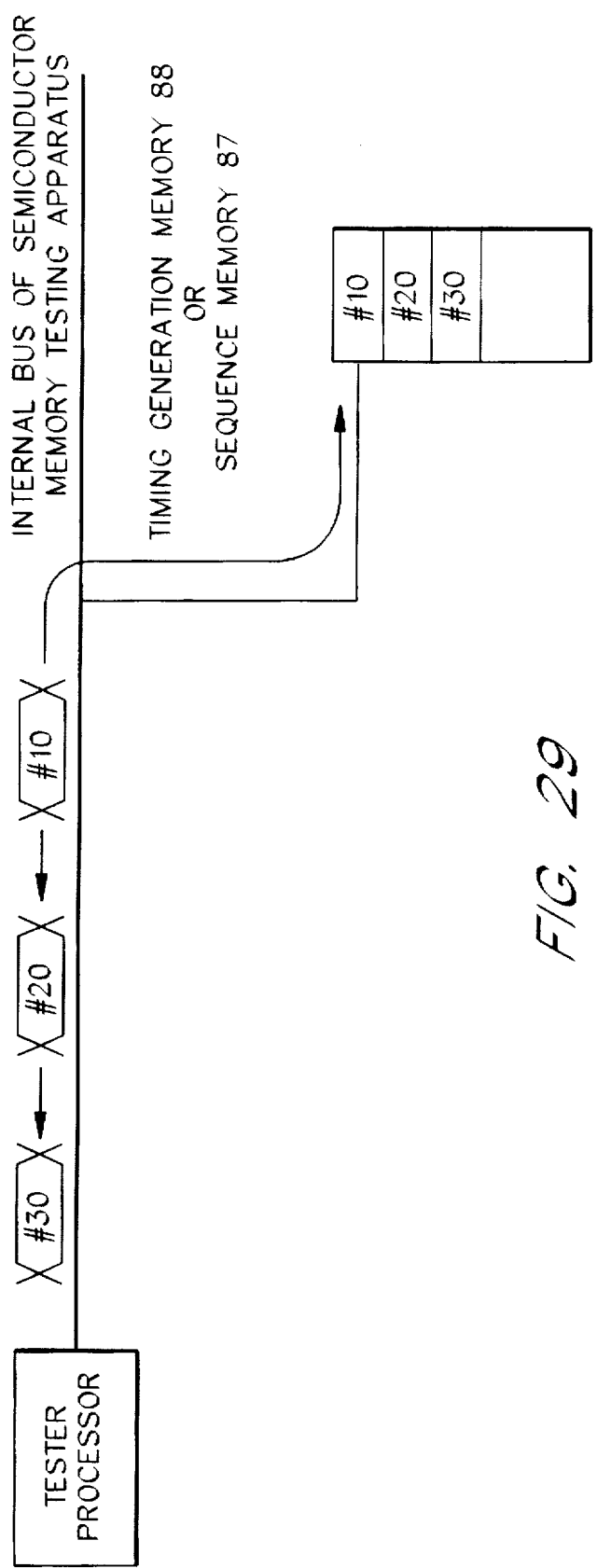
FIG. 29 is a diagram showing the manner in which data stored in the timing generation memory and the sequence memory can be rewritten directly from an internal bus of a tester processor.

The data in the timing generation memory 88 and the sequence memory 87 can be rewritten directly from an internal bus of a tester processor which controls the semiconductor memory testing apparatus in its entirety (see FIG. 29). When the data in the timing generation memory 88 and the sequence memory 87 are rewritten, timing data different from those before being rewritten are generated. For shortening operation cycles using a high-speed DRAM, the operation cycles can be shortened by modifying the data stored in the timing generation memory 88.

Because timing signals for all the operation modes of the DRAM 7 can be generated by storing timing data and sequence data stored respectively into the timing generation memory 88 and the sequence memory 87, all the operation modes of the failure analysis memory can be handled. Since the timing generation memory 88 may be constructed of only a counter and a memory, its circuit can easily be designed without difficulty. By rewriting the timing data, different timing signals can be generated from the internal bus of the tester processor without the need for any circuit modifications. Consequently, operation cycles can be reduced for speeding up the failure analysis memory using a highspeed DRAM.

While preferred embodiments of the present invention have been described using specific terms, such description is for illustrative purposes only, and it is to be understood that changes and variations may be made without departing from the spirit or scope of the following claims.

What is claimed is:

1. A semiconductor memory testing apparatus for testing a semiconductor memory, comprising:
    a memory unit having an address space substantially equal to the address space of a semiconductor memory under test, for storing failure data of the semiconductor memory under test, said memory unit comprising a plurality of interleaved DRAMs;
    buffer memory means associated respectively with said DRAMs, for temporarily storing failure data stored in said DRAMs and addresses thereof;
    storage control means associated respectively with said DRAMs, for storing failure addresses whose row addresses correspond to the DRAMs, among inputted failure addresses, into said buffer memory means associated respectively with said DRAMs; and
    write control means associated respectively with said DRAMs, for reading the failure data from said buffer memory means and writing the failure data into said DRAMs in a high-speed write mode.

2. A semiconductor memory testing apparatus according to claim 1, wherein each of said storage control means comprises means for starting a comparison between a presently inputted row address and a previously inputted row address when the corresponding buffer memory means is empty, and, if the compared row addresses agree with each other, outputting a failure address storage control signal to store a failure address into the corresponding buffer memory means and incrementing the number of times that a failure address is stored into the corresponding buffer memory means, repeating the starting of the comparison, the outputting of the failure address storage control signal, and incrementing said number of times each time a row address is inputted, and stopping the comparison between the row addresses when said number of times represents a state immediately prior to an overflow of said buffer memory means.

3. A semiconductor memory testing apparatus according to claim 1, wherein each of said storage control means comprises a buffer counter for counting the number of times that a failure address is stored into the corresponding buffer memory means, a comparison flag which is in an ON state when said buffer counter represents that the corresponding buffer memory means is empty and is in an OFF state when said buffer counter represents that the corresponding buffer memory means is full, address comparison means for detecting agreement or disagreement between a presently inputted row address and a previously inputted row address when said comparison flag is in the ON state, and incrementing said buffer counter when agreement between the row addresses is detected, means responsive to failure data, for outputting a failure address storage control signal to the corresponding buffer memory means when agreement between the row addresses is detected by said address comparison means, and further means for counting up and indicating the next empty DRAM when agreement between the row addresses is detected by said address comparison means for all said storage control means.

4. A semiconductor memory testing apparatus for testing a semiconductor memory, comprising:
    a memory unit having an address space substantially equal to the address space of a semiconductor memory under test, for storing failure data of the semiconductor memory under test, said memory unit comprising a plurality of interleaved DRAMs;
    buffer memory means associated respectively with said DRAMs, for temporarily storing failure data stored in said DRAMs and addresses thereof; and
    address converting means for converting random addresses from a pattern generator into serial addresses.

5. A semiconductor memory testing apparatus according to claim 4, wherein said address converting means comprises a serial address generating pointer for generating serial addresses, and a conversion memory for writing therein said serial addresses based on addresses and a write signal from said pattern generator and reading therefrom said serial addresses based on address signals and a read signal from said pattern generator.

6. A semiconductor memory testing apparatus according to claim 5, further including:
    a plurality of multiplexers associated respectively with said DRAMs, for switchingly outputting row addresses and column addresses read from said buffer memory means;
    an address converter for converting random addresses from the pattern generator into serial addresses;

an address selector for dividing serial addresses outputted from said address converter into row addresses and column addresses and outputting the row addresses and the column addresses to said buffer memory means;

an address agreement detector for being supplied with row addresses outputted from said address selector, and, if a presently inputted row address and a previously inputted row address agree with each other, outputting a page flag signal indicative of a page mode of operation;

a buffer counter for counting failure cycles and returning a count to zero when the failure cycles are counted up to a maximum value;

a bank counter for counting when the failure cycles are counted up to said maximum value by said buffer counter;

a failure storage signal generator for decoding a count of said bank counter and outputting a failure storage signal which is a write signal for failure data to the corresponding buffer memory means; and a plurality of memory controllers associated respectively with said DRAMs, for being supplied with said page flag signal and said failure storage signal, outputting a switching signal to said multiplexers and outputting timing signals to said DRAMs, refreshing said DRAMs, and storing failure data into said DRAMs in a read/modify/write mode.

7. A semiconductor memory testing apparatus according to claim 6, wherein each of said memory controllers comprises:

a refresh timer for generating a refresh request signal;

a failure storage trigger generator for being supplied with said failure storage signal and a one-address storage signal which is outputted each time the storage of failure data into the corresponding DRAM is finished, turning on a failure storage operation flag and outputting a failure storage trigger signal to start storing the failure data from the buffer memory means into the DRAM when a refresh operation flag is turned off and a count of the failure storage signal and a count of said one-address storage signal disagree with each other;

a refresh trigger generator responsive to said refresh request signal for turning on said refresh operation flag and outputting a refresh start signal when said failure storage operation flag is turned off;

a read/modify/write circuit for effecting the read/modify/write mode to store failure data into the DRAM;

a timing generation memory for storing in advance timing data to refresh the DRAM and store the failure data into the DRAM;

a program counter for generating address pointers for said timing generation memory;

a sequence memory for storing sequence data to increment, decrement, and hold data in said program counter, said sequence memory having address pointers generated by said program counters; and a sequence controller for operating said program counter according to the sequence data outputted from said sequence memory in response to the failure storage trigger signal outputted from said failure storage trigger generator or the refresh start signal outputted from said refresh trigger generator.

8. A semiconductor memory testing apparatus according to claim 7, wherein said failure storage trigger generator comprises:

an buffer memory storage counter for counting said failure storage signal;

a DRAM storage counter for counting said one-address storage signal;

a counter comparator for comparing a count of said buffer memory storage counter and a count of said DRAM storage counter with each other; and a circuit for generating and outputting said failure storage trigger signal when the counts of said buffer memory storage counter and said DRAM storage counter disagree with each other and failure data is not stored into the DRAM, and when the counts of said buffer memory storage counter and said DRAM storage counter disagree with each other and said page mode or said read/modify/write mode for storing failure data into the DRAM is finished.

9. A semiconductor memory testing apparatus for testing a semiconductor memory, comprising:

a memory unit having an address space substantially equal to the address space of a semiconductor memory under test, for storing failure data of the semiconductor memory under test, said memory unit comprising a plurality of interleaved DRAMs;

buffer memory means associated respectively with said DRAMs, for temporarily storing failure data stored in said DRAMs and addresses thereof;

a plurality of multiplexers associated respectively with said DRAMs, for switchingly outputting row addresses and column addresses read from said buffer memory means;

an address converter for converting random addresses from the pattern generator into serial addresses;

an address selector for dividing serial addresses outputted from said address converter into row addresses and column addresses and outputting the row addresses and the column addresses to said buffer memory means;

a read/write request signal generator for being supplied with row addresses outputted from said address selector, and, if a presently inputted row address and a previously inputted row address agree with each other, outputting a page flag signal indicative of a page mode of operation, and outputting a read/write request signal for reading and writing failure data to the corresponding buffer memory means when failure data are to be written into and read from the buffer memory means; and a plurality of memory controllers associated respectively with said DRAMs, for being supplied with said page flag signal and said read/write request signal, outputting a switching signal to said multiplexers and outputting timing signals to said DRAMs, refreshing said DRAMs, and storing failure data into said DRAMs in a read/modify/write mode.

10. A semiconductor memory testing apparatus according to claim 9, wherein each of said memory controllers comprises:

a refresh timer for generating a refresh request signal;

a read/write trigger generator for being supplied with said failure storage signal and a one-ad dress storage signal which is outputted each time the storage of failure data into the corresponding DRAM is finished, turning on a read/write operation flag and outputting a read/write trigger signal to start a read/write mode of operation of the DRAM when a refresh operation flag is turned off and the read/write request signal is supplied;

a refresh trigger generator responsive to said refresh request signal for turning on said refresh operation flag and outputting a refresh start signal when said failure storage operation flag is turned off;

a circuit for effecting operation modes of the DRAM;

a timing generation memory for storing in advance timing data to refresh the DRAM and store the failure data into the DRAM;

a program counter for generating address pointers for said timing generation memory;

a sequence memory for storing sequence data to increment, decrement, and hold data in said program counter, said sequence memory having address pointers generated by said program counters;

an operation mode register for storing start addresses of said timing generation memory and said sequence memory in each of the operation modes; and a sequence controller for operating said program counter according to the sequence data outputted from said sequence memory in response to the read/write trigger signal outputted from said read/write trigger generator or the refresh start signal outputted from said refresh trigger generator.

11. A semiconductor memory testing apparatus according to claim 10, wherein the data stored in said timing generation memory and said sequence memory can be rewritten from a tester processor which controls the semiconductor memory testing apparatus in its entirety.

12. A semiconductor memory testing apparatus according to any one of claims 1, 4, and 9, wherein each of said buffer memory means comprises an FIFO memory.

* * * * *